(12) United States Patent
Cho et al.

(10) Patent No.: US 12,288,578 B2
(45) Date of Patent: Apr. 29, 2025

(54) SEMICONDUCTOR MEMORY DEVICE AND METHOD OF OPERATING THE SAME

(71) Applicant: SAMSUNG ELECTRONICS CO., LTD., Suwon-si (KR)

(72) Inventors: Sunghye Cho, Hwaseong-si (KR); Kijun Lee, Seoul (KR); Myungkyu Lee, Seoul (KR); Eunae Lee, Hwaseong-si (KR); Byeonggyu Park, Hwaseong-si (KR); Yeonggeol Song, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 372 days.

(21) Appl. No.: 17/864,736

(22) Filed: Jul. 14, 2022

(65) Prior Publication Data
US 2023/0141789 A1    May 11, 2023

(30) Foreign Application Priority Data

Nov. 10, 2021  (KR) .................. 10-2021-0153972
Jan. 3, 2022  (KR) .................. 10-2022-0000084

(51) Int. Cl.
*G11C 11/406* (2006.01)
*G11C 11/4093* (2006.01)

(52) U.S. Cl.
CPC .. *G11C 11/40615* (2013.01); *G11C 11/40618* (2013.01); *G11C 11/4093* (2013.01)

(58) Field of Classification Search
CPC ........ G11C 11/40615; G11C 11/40618; G11C 11/4093
USPC ........................................ 365/222
See application file for complete search history.

(56) References Cited

U.S. PATENT DOCUMENTS

| 8,379,471 | B2 | 2/2013 | Kwean |
| 9,117,544 | B2 | 8/2015 | Bains et al. |
| 9,236,110 | B2 | 1/2016 | Bains et al. |
| 9,449,671 | B2 | 9/2016 | Crawford et al. |
| 9,478,316 | B1 | 10/2016 | Ryu |
| 9,978,440 | B2 | 5/2018 | Cho |

(Continued)

FOREIGN PATENT DOCUMENTS

KR    10-1212738 B1    12/2012

OTHER PUBLICATIONS

European Search Report dated Dec. 23, 2022.

*Primary Examiner* — Connie C Yoha
(74) *Attorney, Agent, or Firm* — Muir Patent Law, PLLC

(57) ABSTRACT

A semiconductor memory device includes a memory cell array including a plurality of memory cell rows, a row hammer management circuit, and a refresh control circuit. The row hammer management circuit captures row addresses accompanied by first active commands randomly selected from active commands, each of which has a first selection probability that is uniform, from an external memory controller during a reference time interval, and selects at least one row address from among the captured row addresses as a hammer address a number of times proportional to access counts of an active command corresponding to the at least one row address during the reference time interval. The refresh control circuit receives the hammer address and performs a hammer refresh operation on one or more victim memory cell rows which are physically adjacent to a memory cell row corresponding to the hammer address.

20 Claims, 27 Drawing Sheets

(56) References Cited

U.S. PATENT DOCUMENTS

| | | |
|---|---|---|
| 2017/0213586 A1 | 7/2017 | Kang et al. |
| 2019/0333573 A1 | 10/2019 | Shin et al. |
| 2023/0143397 A1* | 5/2023 | Hong ................ G11C 11/40618 365/222 |
| 2023/0170009 A1* | 6/2023 | Bang ................ G11C 11/40615 365/103 |

* cited by examiner

| | NUMBER OF ACCESS | NUMBER OF FREF |
|---|---|---|
| R0 | 10K | 100 |
| R1 | 6K | 60 |
| R2 | 4K | 40 |

FIG. 18

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CID0 | CID1 | CID2 |
|  | H | R4 | R5 | R6 | R7 | R8 | R9 | R10 | R11 | R12 | R13 | R14 | R15 | R16 | CID3/R17 |
| WR | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | H | L | V | CID3 |
| RD | L | H | H | H | H | BL | BA0 | BA1 | BG0 | BG1 | BG2 | CID0 | CID1 | CID2 |
|  | H | C2 | C3 | C4 | C5 | C6 | C7 | C8 | C9 | C10 | V | H | V | V | CID3 |

FIG. 19

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| PREab | L | H | H | L | H | L | CID3 | V | V | V | V | L | CID0 | CID1 | CID2 |
| PREsb | L | H | H | L | H | L | CID3 | BA0 | BA1 | V | V | H | CID0 | CID1 | CID2 |
| PREpb | L | H | H | L | H | h | CID3 | BA0 | BA1 | BG0 | BG1 | BG2 | CID0 | CID1 | CID2 |

SEMICONDUCTOR MEMORY DEVICE AND METHOD OF OPERATING THE SAME

CROSS-REFERENCE TO RELATED APPLICATIONS

This application claims the benefit of priority under 35 U.S.C. § 119 to Korean Patent Application No. 10-2021-0153972, filed on Nov. 10, 2021, and to Korean Patent Application No. 10-2022-0000084, filed on Jan. 3, 2022, in the Korean Intellectual Property Office, the disclosure of each of which is incorporated by reference in its entirety herein.

BACKGROUND

1. Field

Example embodiments relate to a semiconductor memory device and a method of operating the same.

2. Description of the Related Art

A semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

In volatile memory devices such as dynamic random access memory (DRAM) devices, cell charges stored in a memory cell may be lost by a leakage current. In addition, when a word-line is transitioned frequently between an active state and a precharged state (i.e., when the word-line has been accessed intensively or frequently), an affected memory cell connected to a word-line that is adjacent to the frequently accessed word-line may lose stored charges. Charges stored in a memory cell may be maintained by recharging before data is lost by leakage of cell charges. Such recharge of cell charges is referred to as a refresh operation, and a refresh operation may be performed repeatedly before cell charges are significantly lost.

SUMMARY

According to an embodiment, a semiconductor memory device includes a memory cell array, a row hammer management circuit, and a refresh control circuit. The memory cell array includes a plurality of memory cell rows, and each of the plurality of memory cell rows includes a plurality of volatile memory cells. The row hammer management circuit captures row addresses accompanied by first active commands randomly selected from active commands, each of which has a first selection probability that is uniform, from an external memory controller during a reference time interval, and selects at least one row address from among the captured row addresses as a hammer address a number of times proportional to access counts of an active command corresponding to the at least one row address during the reference time interval. The refresh control circuit receives the hammer address and performs a hammer refresh operation on one or more victim memory cell rows which are physically adjacent to a memory cell row corresponding to the hammer address.

According to an embodiment, there is provided a method of operating a semiconductor memory device including a memory cell array that includes a plurality of memory cell rows, each of which includes a plurality of volatile memory cells. According to the method, row addresses are captured and the row addresses are accompanied by first active commands randomly selected from active commands, each of which has a first selection probability that is uniform, from an external memory controller during a reference time interval, at least one row address is selected from among the captured row addresses as a hammer address a number of times proportional to access counts of an active command corresponding to the at least one row address during the reference time interval, and a hammer refresh operation is performed on one or more victim memory cell rows which are physically adjacent to a memory cell row corresponding to the hammer address.

According to an embodiment, a semiconductor memory device includes a memory cell array, a row hammer management circuit, and a refresh control circuit. The memory cell array includes a plurality of memory cell rows, and each of the plurality of memory cell rows includes a plurality of volatile memory cells. The row hammer management circuit captures row addresses accompanied by first active commands randomly selected from active commands, each of which has a first selection probability that is uniform, from an external memory controller during a reference time interval, and selects at least one row address from among the captured row addresses as a hammer address a number of times proportional to access counts of an active command corresponding to the at least one row address during the reference time interval. The refresh control circuit receives the hammer address and performs a hammer refresh operation on one or more victim memory cell rows which are physically adjacent to a memory cell row corresponding to the hammer address. The first selection probability corresponds to a ratio of a number of the hammer refresh operation to be performed on the plurality of memory cell rows during a refresh period of the semiconductor memory device to an average access count of the plurality of memory cell rows during the reference time interval. The row hammer management circuit selects a portion of the row addresses accompanied by the first active commands which are randomly selected based on a random binary code that varies randomly in response to the active commands matching a reference binary code.

BRIEF DESCRIPTION OF THE DRAWINGS

Features will become apparent to those of skill in the art by describing in detail example embodiments with reference to the attached drawings in which:

FIGS. 18 and 19 illustrate example commands which may be used in the memory system of FIG. 1.

DETAILED DESCRIPTION

Figure 1:
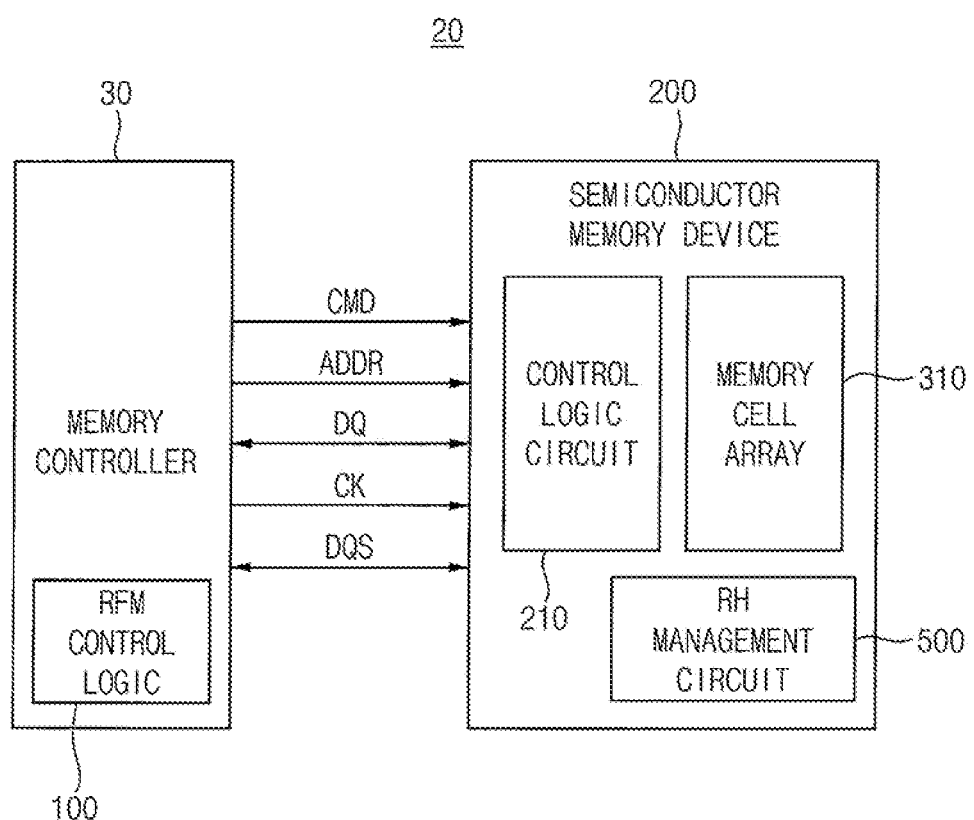
FIG. 1 is a block diagram illustrating a memory system according to an example embodiment.

FIG. 1 is a block diagram illustrating a memory system according to an example embodiment.

Referring to FIG. 1, a memory system 20 may include a memory controller 30 and a semiconductor memory device 200.

The memory controller 30 may control overall operation of the memory system 20. The memory controller 30 may control overall data exchange between an external host and the semiconductor memory device 200. For example, the memory controller 30 may write data in the semiconductor memory device 200, or read data from the semiconductor memory device 200 in response to a request from the host.

The memory controller 30 may issue operation commands to the semiconductor memory device 200 for controlling the semiconductor memory device 200. The semiconductor memory device 200 may be a memory device including dynamic memory cells such as a dynamic random access memory (DRAM), double data rate 5 (DDR5) synchronous DRAM (SDRAM), or a DDR6 SDRAM.

The memory controller 30 may transmit a clock signal CK (the clock signal CK may be referred to a command clock signal), a command CMD, and an address (signal) ADDR to the semiconductor memory device 200. The memory controller 30 may exchange a (data) strobe signal DQS with the semiconductor memory device 200 when the memory controller 30 writes data signal DQ in the semiconductor memory device 200 or reads data signal DQ from the semiconductor memory device 200. The address ADDR may be accompanied by the command CMD, and the address ADDR may be referred to as an access address.

The memory controller 30 may include a refresh management (RFM) control logic 100 that generates an RFM command associated with a row hammer of the plurality of memory cell rows.

The semiconductor memory device 200 may include a memory cell array 310, which stores data corresponding to the data signal DQ, a control logic circuit 210, and a row hammer (RH) management circuit 500.

The control logic circuit 210 may control operations of the semiconductor memory device 200. The memory cell array 310 may include a plurality of memory cell rows, and each of the memory cell rows may include a plurality of volatile memory cells.

The row hammer management circuit 500 may capture row addresses accompanied by first active commands randomly selected from active commands, each having a first selection probability that is uniform, from the memory controller 30 during a reference time interval, and may select at least one row address from among the captured row addresses as a hammer address a number of times that is proportional to access counts of an active command corresponding to the at least one row address during the reference time interval.

The reference time interval may correspond to a refresh interval between refresh cycles during which the plurality of memory cell rows are refreshed, of the semiconductor memory device 200. The first selection probability may correspond to a ratio of a number of the hammer refresh operation to be performed on the plurality of memory cell rows during a refresh period of the semiconductor memory device 200 to an average access count of the plurality of memory cell rows during the reference time interval.

For example, when the average access count of the plurality of memory cell rows during the reference time interval corresponds to K (K is a natural number equal to or greater than three) and the number of the hammer refresh operation to be performed on the plurality of memory cell rows during the refresh period corresponds to L (L is a natural number equal to or greater than two and smaller than L), the first selection probability corresponds to L/K The semiconductor memory device 200 may perform a refresh operation periodically due to charge leakage of memory cells storing data. Due to scale down of the manufacturing process of the semiconductor memory device 200, a storage capacitance of the memory cell may be decreased, and a refresh period may be shortened. The refresh period may be further shortened because the entire refresh time may be increased as the memory capacity of the semiconductor memory device 200 is increased.

To compensate for degradation of adjacent memory cells due to the intensive access to a particular row or a hammer address, a target row refresh (TRR) scheme may be adopted and an in-memory refresh scheme may be adopted to reduce the burden of the memory controller. In an implementation, the memory controller is totally responsible for the hammer refresh operation in the TRR scheme, and the semiconductor memory device is totally responsible for the hammer refresh operation in the in-memory refresh scheme.

The chip size overhead for the in-memory refresh may become serious as the memory capacity is increased and demands on low power consumption of the semiconductor memory device are increased. In addition, the power consumption may be increased when the semiconductor memory device has to take care of the hammer refresh operation, even when there is no intensive access. In addition, a row hammer of some of memory cell row selected from the plurality of the memory cell rows may be managed.

In the semiconductor memory device 200 according to the present example embodiment, the row hammer management circuit 500 may generate the hammer address in proportion to an access number (counts) of each of the memory cell rows, and a refresh control circuit (400 in FIG. 3) may perform a hammer refresh operation on victim memory cell rows which are physically adjacent to a memory cell row corresponding to the hammer address in proportion to the access number (counts) of each of the memory cell rows. Therefore, row hammer due to non-uniform access patterns may be prevented.

Figure 2:
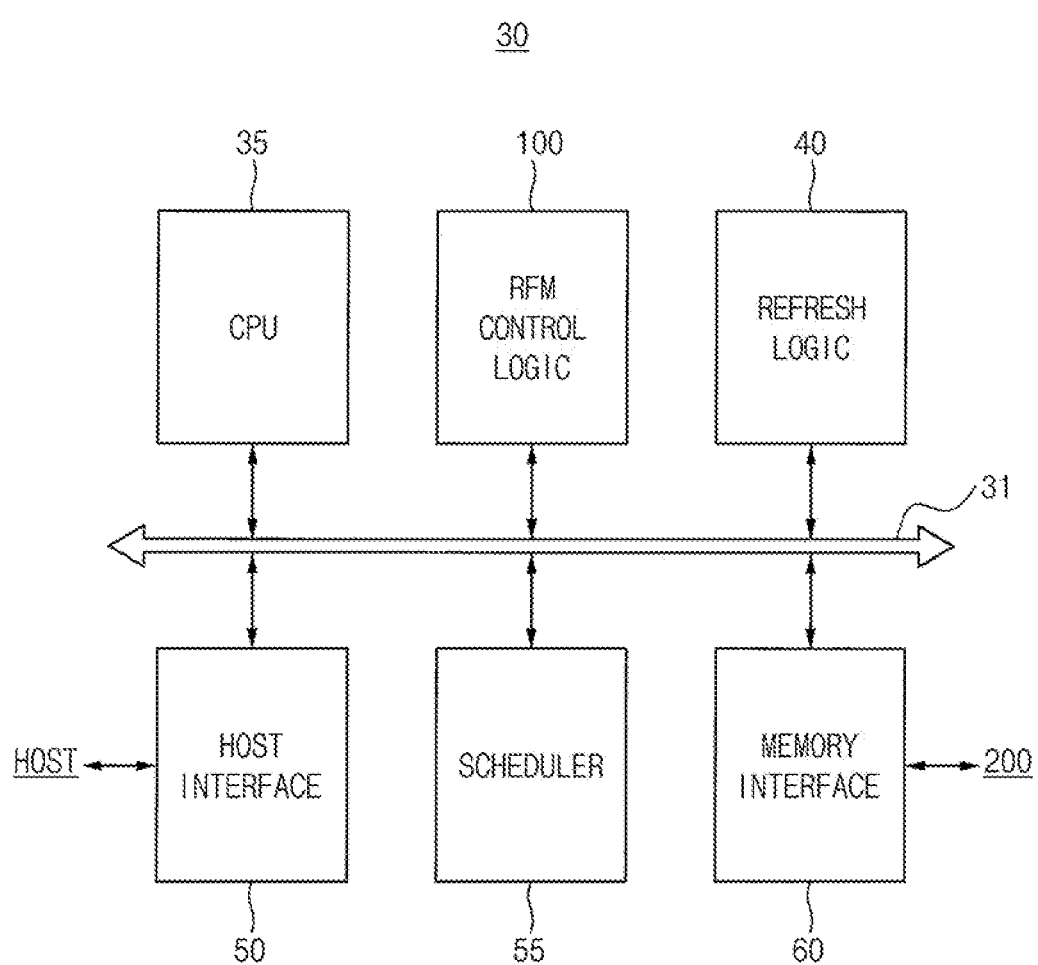
FIG. 2 is a block diagram illustrating the memory controller in FIG. 1 according to an example embodiment.

FIG. 2 is a block diagram illustrating the memory controller in FIG. 1 according to an example embodiment.

Referring to FIG. 2, the memory controller 30 may include a central processing unit (CPU) 35, the RFM control logic 100, a refresh logic 40, a host interface 50, a scheduler 55, and a memory interface 60, which are connected to each other through a bus 31.

The CPU 35 may control overall operation of the memory controller 30. The CPU 35 may control the RFM control logic 100, the refresh logic 40, the host interface 50, the scheduler 55, and the memory interface 60, through the bus 31.

The refresh logic 40 may generate an auto refresh command for refreshing memory cells of the plurality of memory cell rows based on a refresh period of the semiconductor memory device 200.

The host interface 50 may perform interfacing with a host.

The memory interface 60 may perform interfacing with the semiconductor memory device 200.

The scheduler 55 may manage scheduling and transmission of sequences of commands generated in the memory controller 30. The scheduler 55 may transmit the active command and subsequent commands to the semiconductor memory device 200, via the memory interface 60.

Figure 3:
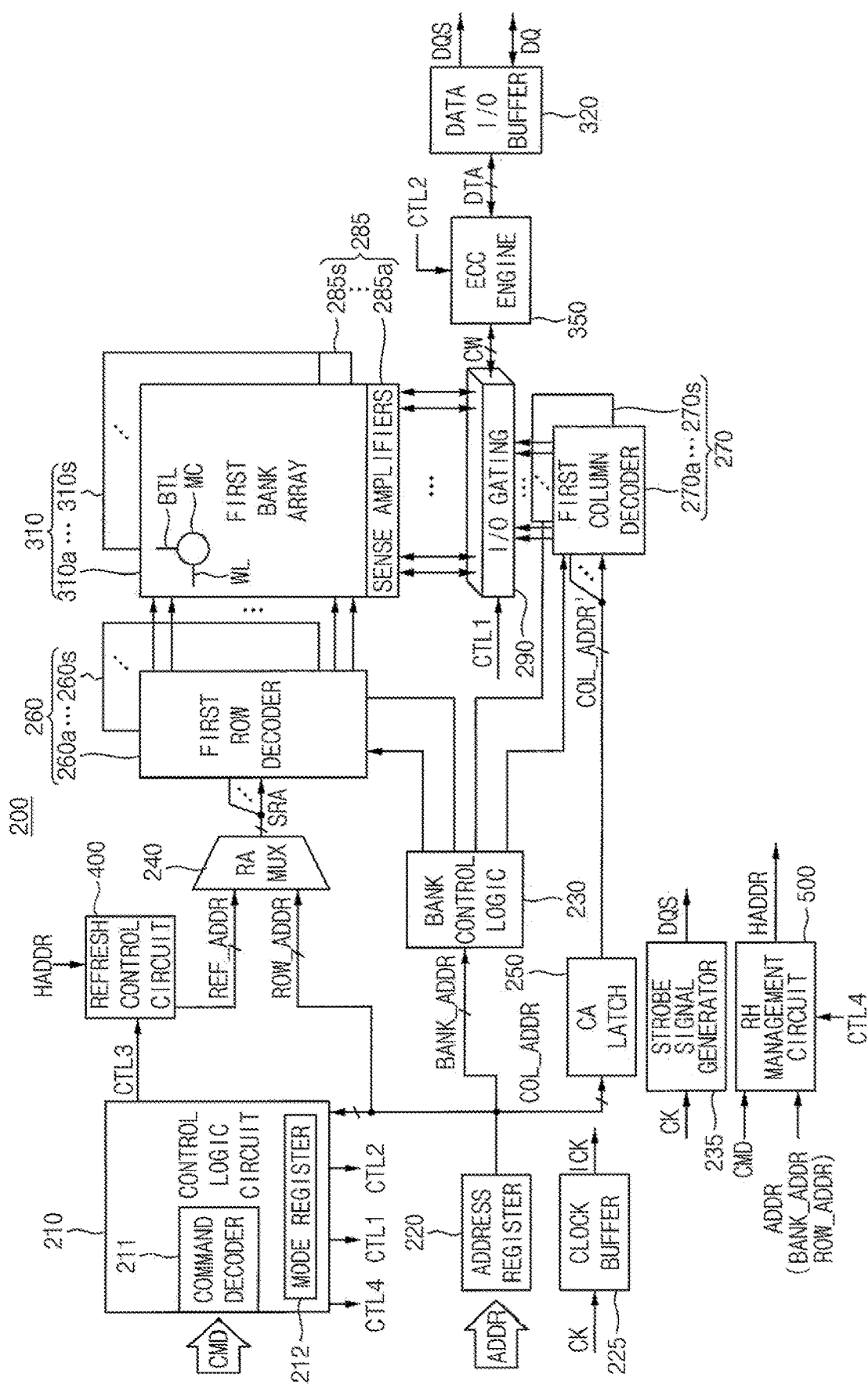
FIG. 3 is a block diagram illustrating an example of the semiconductor memory device in FIG. 1 according to an example embodiment.

FIG. 3 is a block diagram illustrating an example of the semiconductor memory device in FIG. 1 according to an example embodiment.

Referring to FIG. 3, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an input/output (I/O) gating circuit 290, an error correction code (ECC) engine 350, a clock buffer 225, a strobe signal generator 235, the row hammer management circuit 500, and a data I/O buffer 320.

The memory cell array 310 may include first through sixteenth bank arrays 310a~310s. The row decoder 260 may include first through sixteenth row decoders 260a~260s respectively coupled to the first through sixteenth bank arrays 310a~310s. The column decoder 270 may include first through sixteenth column decoders 270a~270s respectively coupled to the first through sixteenth bank arrays 310a~310s. The sense amplifier unit 285 may include first through sixteenth sense amplifiers 285a~285s respectively coupled to the first through sixteenth bank arrays 310a~310s.

The first through sixteenth bank arrays 310a~310s, the first through sixteenth row decoders 260a~260s, the first through sixteenth column decoders 270a~270s, and first through sixteenth sense amplifiers 285a~285s may form first through sixteenth banks. Each of the first through sixteenth bank arrays 310a~310s may include a plurality of memory cells MC at intersections of a plurality of word-lines WL and a plurality of bit-line BTL.

The address register 220 may receive the address ADDR including a bank address BANK_ADDR, a row address ROW_ADDR, and a column address COL_ADDR from the memory controller 30. The address register 220 may provide the received bank address BANK ADDR to the bank control logic 230, may provide the received row address ROW ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260a~260s corresponding to the bank address BANK_ADDR may be activated in response to the bank control signals. One of the first through sixteenth column decoders 270a~270s corresponding to the bank address BANK_ADDR may be activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW ADDR or the refresh row address REF_ADDR as a row address SRA. The row address SRA that is output from the row address multiplexer 240 may be applied to the first through sixteenth row decoders 260a~260s.

The refresh control circuit 400 may sequentially increase or decrease the refresh row address REF_ADDR in a normal refresh mode, in response to a third control signal CTL3 from the control logic circuit 210. The refresh control circuit 400 may receive a hammer address HADDR in a hammer refresh mode, and may output hammer refresh row addresses designating one or more victim memory cell rows physically adjacent to a memory cell row corresponding to the hammer address as the refresh row address REF ADDR.

The activated one of the first through sixteenth row decoders 260a~260s, by the bank control logic 230, may decode the row address SRA that is output from the row address multiplexer 240, and may activate a word-line corresponding to the row address SRA. For example, the activated bank row decoder may apply a word-line driving voltage to the word-line corresponding to the row address.

The column address latch 250 may receive the column address COL_ADDR from the address register 220, and may temporarily store the received column address COL_ADDR. In a burst mode, the column address latch 250 may generate column address COL_ADDR' that increments from the received column address COL_ADDR. The column address latch 250 may apply the temporarily stored or generated column address COL_ADDR' to the first through sixteenth column decoders 270a~270s.

The activated one of the first through sixteenth column decoders 270a~270s may activate a sense amplifier corresponding to the bank address BANK_ADDR and the column address COL_ADDR through the I/O gating circuit 290.

The I/O gating circuit 290 may include a circuitry for gating input/output data, input data mask logic, read data latches for storing data that is output from the first through sixteenth bank arrays 310a~310s, and write drivers for writing data to the first through sixteenth bank arrays 310a~310s.

A codeword CW read from a selected bank array of the first through sixteenth bank arrays 310a~310s may be sensed by a sense amplifier coupled to the selected bank array from which the data is to be read, and may be stored in the read data latches. The codeword CW stored in the read data latches may be provided to the data I/O buffer 320 as data DTA after ECC decoding is performed on the codeword CW by the ECC engine 350. The data I/O buffer 320 may convert the data DTA into the data signal DQ, and may transmit the data signal DQ along with the data strobe signal DQS to the memory controller 30.

The data signal DQ to be written in a selected bank array of the first through sixteenth bank arrays 310a~310s may be provided to the data I/O buffer 320 from the memory controller 30. The data I/O buffer 320 may convert the data signal DQ to the data DTA, and may provide the data DTA to the ECC engine 350. The ECC engine 350 may perform an ECC encoding on the data DTA to generate parity bits. The ECC engine 3500 may provide the codeword CW including data DTA and the parity bits to the I/O gating circuit 290. The I/O gating circuit 290 may write the codeword CW in a sub-page in the selected bank array through the write drivers.

The data I/O buffer 320 may provide the data signal DQ from the memory controller 30 to the ECC engine 350 by converting the data signal DQ to the data DTA in a write operation of the semiconductor memory device 200, may convert the data DTA to the data signal DQ from the ECC engine 350, and may transmit the data signal DQ and the data strobe signal DQS to the memory controller 30 in a read operation of the semiconductor memory device 200.

The ECC engine 350 may perform an ECC encoding on the data DTA, and may perform an ECC decoding on the codeword CW based on a second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The strobe signal generator 235 may receive the clock signal CK, may generate the data strobe signal DQS based on the clock signal CK, and may provide the data strobe signal DQS to the memory controller 30.

The control logic circuit 210 may control operations of the semiconductor memory device 200. For example, the control logic circuit 210 may generate control signals for the semiconductor memory device 200 in order to perform a write operation, a read operation, a normal refresh operation, and a hammer refresh operation. The control logic circuit 210 may include a command decoder 211, which decodes the command CMD received from the memory controller 30, and a mode register set (MRS) 212, which sets an operation mode of the semiconductor memory device 200.

The command decoder 211 may generate the control signals corresponding to the command CMD by decoding a write enable signal, a row address strobe signal, a column address strobe signal, a chip select signal, etc. The control logic circuit 210 may provide a first control signal CTL1 to the I/O gating circuit, the second control signal CTL2 to control the ECC engine 350, the third control signal CTL3 to control the refresh control circuit 400, and a fourth control signal CTL4 to control the row hammer management circuit 500.

The row hammer management circuit 500 may receive the address ADDR (including the bank address BANK_ADDR and the row address ROW_ADDR), may capture row addresses accompanied by first active commands randomly selected from active commands during a reference time interval in response to the command CMD corresponding to the active command, and may output at least one row address from among the captured row addresses as the hammer address HADDR a number of times that is proportional to access counts of an active command corresponding to the at least one row address during the reference time interval.

Figure 4:
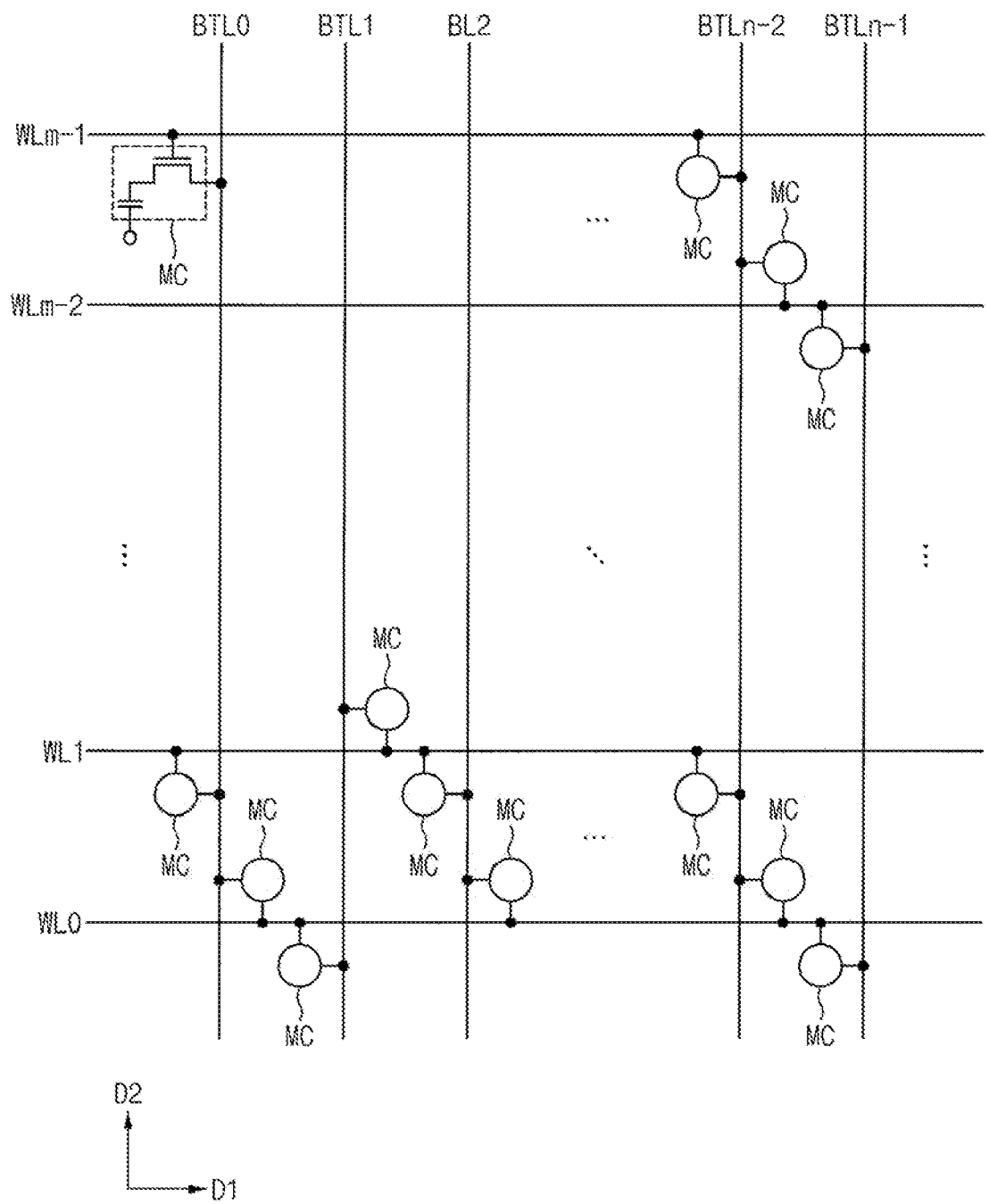
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 310a may include a plurality of word-lines WL0~WLm−1 (m is a natural number greater than two), a plurality of bit-lines BTL0~BTLn−1 (n is a natural number greater than two), and a plurality of volatile memory cells MCs disposed at intersections between the word-lines WL0~WLm−1 and the bit-lines BTL0~BTLn−1. Each of the memory cells MCs may include a cell transistor coupled to each of the word-lines WL0~WLm−1 and each of the bit-lines BTL0~BTLn−1, and a cell capacitor coupled to the cell transistor. Each of the memory cells MCs may have a DRAM cell structure. The word-lines WL0~WLm−1 bit-lines BTL0~BTLn−1 may extend in a first direction D1, and the bit-lines BTL1~BTLn may extend in a second direction D2 crossing the first direction D1.

The word-lines WL0~WLm−1 coupled to a plurality of memory cells MCs may be referred to as rows of the first bank array 310a. The bit-lines BTL0~BTLn−1 coupled to a plurality of memory cells MCs may be referred to as columns of the first bank array 310a.

Figure 5:
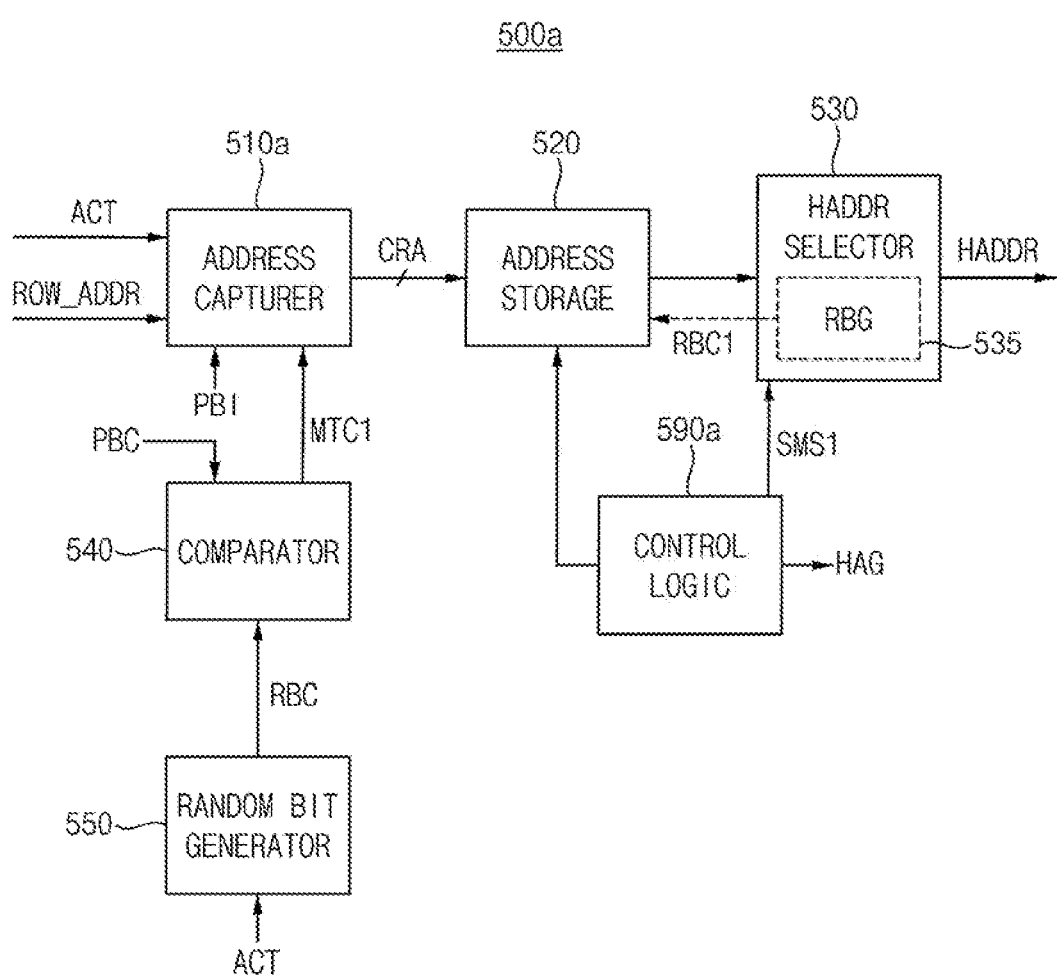
FIG. 5 is a block diagram illustrating an example of the row hammer management circuit in FIG. 3 according to an example embodiment.

FIG. 5 is a block diagram illustrating an example of the row hammer management circuit in FIG. 3 according to an example embodiment.

Referring to FIG. 5, a row hammer management circuit 500a may include an address capturer 510a, an address storage 520, a hammer address (HADDR) selector 530, a comparator 540, a random bit generator 550, and a control logic 590a. Each element included in the row hammer management circuit 500a may be a logic circuit capable of performing respective functions.

The random bit generator 550 may generate a random binary code RBC, which varies randomly, in response to active commands ACT. The random binary code RBC may include a plurality of bits. The random bit generator 550 may output the random binary code RBC based on the random bit generator 550 receiving each of the active commands ACT. The random binary code RBC may be a pseudo random sequence, e.g., the random bit generator 550 may generate the random binary code RBC, periodically repeated in response to the active commands ACT, when the random binary code RBC corresponds to a pseudo random sequence.

The comparator 540 may compare the random binary code RBC and a reference binary code PBC, to output a matching signal MTC1 based on a result of the comparison. The reference binary code PBC may be the same as at least one of the values of the random binary code RBC output from the random bit generator 540.

The reference binary code PBC may be provided from an external register or may be stored in a register in the comparator 540. When bits of the random binary code RBC are the same as bits of the reference binary code PBC (i.e., when the random binary code RBC matches the reference binary code PBC), the comparator 540 may output the matching signal MTC1 to the address capturer 510*a*. For example, when the random binary code RBC is periodically repeated, the comparator 540 may output the matching signal MTC1 which is periodically repeated based on the random binary code RBC.

The comparator 540 may compare the random binary code RBC with a plurality of reference binary codes PBC. In this case, a frequency of generating the matching signal MTC1 may vary according to a number of the reference binary codes PBC. For example, a frequency of generating the matching signal MTC1 may increase as the number of the reference binary codes PBC increases.

The address capturer 510*a* may receive the row address ROW_ADDR accompanied by the active commands ACT, and may output row addresses accompanied by first active commands randomly selected from the active commands ACT in response to the matching signal MTC1 as captured row addresses CRA. Each of the active commands ACT may have a first selection probability that is uniform based on probability information PBI. Thus, the address capturer 510*a* may select at least a portion of the active commands ACT with the first selection probability that is uniform based on probability information PBI as the captured row addresses CRA.

The hammer address selector 530 may select at least one of the captured row addresses CRA stored in the address storage 520, to output the selected one as the hammer address HADDR.

The address storage 520 may store the captured row addresses CRA sequentially.

The control logic 590*a* may control the address storage 520 and the hammer address selector 530. The control logic 590*a* may control storing the captured row addresses CRA in the address storage 520, and may manage the address storage 520.

The control logic 590*a* may control a selection mode of the hammer address selector 530, associated with selecting the hammer address HADDR, by applying a selection mode signal SMS1 to the hammer address selector 530. The control logic 590*a* may provide the refresh control circuit 400 in FIG. 3 with a hammer address generation signal HAG indicating that the hammer address selector 530 outputs the hammer address HADDR.

In response to the selection mode signal SMS1 having a first logic level, the hammer address selector 530 may output the captured row addresses CRA as the hammer address HADDR according to an order of being stored in the address storage 520. In response to the selection mode signal SMS1 having a second logic level, the hammer address selector 530 may output the captured row addresses CRA as the hammer address HADDR randomly with a second selection probability that is uniform.

The hammer address selector 530 may include a random bit generator (RBG) 535 therein. The random bit generator 535 may provide the address storage 520 with a random binary code RBC1 in response to the selection mode signal SMS1 having a second logic level. The address storage 520 may provide the hammer address selector 530 with one of the captured row addresses CRA in response to the random binary code RBC1.

Thus, the row hammer management circuit 500*a* may select a portion of the row addresses ROW_ADDR accompanied by the first active commands ACT which are randomly selected based on the random binary code RBC that varies randomly in response to the active commands ACT matching the reference binary code PBC.

Figures 6, 7:
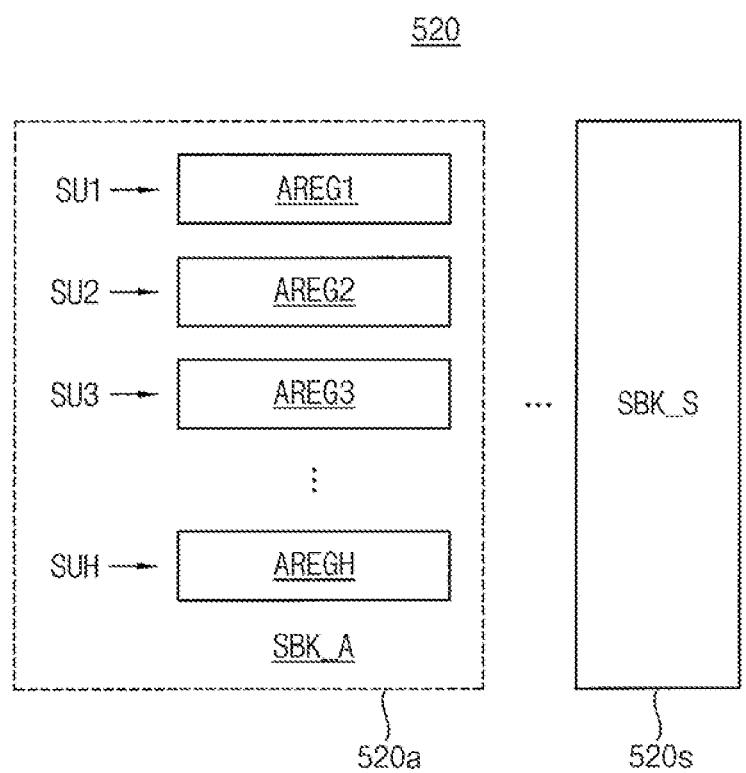
FIG. 6 is a block diagram illustrating an example of the address storage included in the row hammer management circuit of FIG. 5 according to an example embodiment.
FIG. 7 is a diagram for explaining a hammer refresh operation performed in proportion to access ratio.

FIG. 6 is a block diagram illustrating an example of the address storage included in the row hammer management circuit of FIG. 5 according to an example embodiment.

Referring to FIG. 6, the address storage 520 may include a plurality of storage blocks SBK_A~SBK_S 520*a*~520*s*, where s may be an integer greater than two, and each of the storage blocks 520*a*~520*s* may include a plurality of storage units SU1~SUH, where H may be an integer greater than three. The storage blocks 520*a*~520*s* may have the same configuration, and thus the one storage block 520*a* is described.

The storage units SU1~SUH may include address registers AREG1~AREGH storing the row addresses that are accessed.

FIG. 7 is a diagram for explaining a hammer refresh operation performed in proportion to access ratio.

The example in FIG. 7 shows that, when a number of access count associated with a row address R0 corresponds to 10000, a number of access count associated with a row address R1 corresponds to 6000, and a number of access count associated with a row address R2 corresponds to 4000 during the reference time interval, a hammer refresh operation HREF is performed 100 times on one or more victim memory cell rows physically adjacent to a memory cell row designated by the row address R0, a hammer refresh operation HREF is performed 60 times on one or more victim memory cell rows physically adjacent to a memory cell row designated by the row address R1, and a hammer refresh operation HREF is performed 40 times on one or more victim memory cell rows physically adjacent to a memory cell row designated by the row address R2. Thus, the hammer refresh operation HREF is performed on victim memory cell row in proportion to the number of access count of the row addresses R0, R1, and R2.

Figure 8:
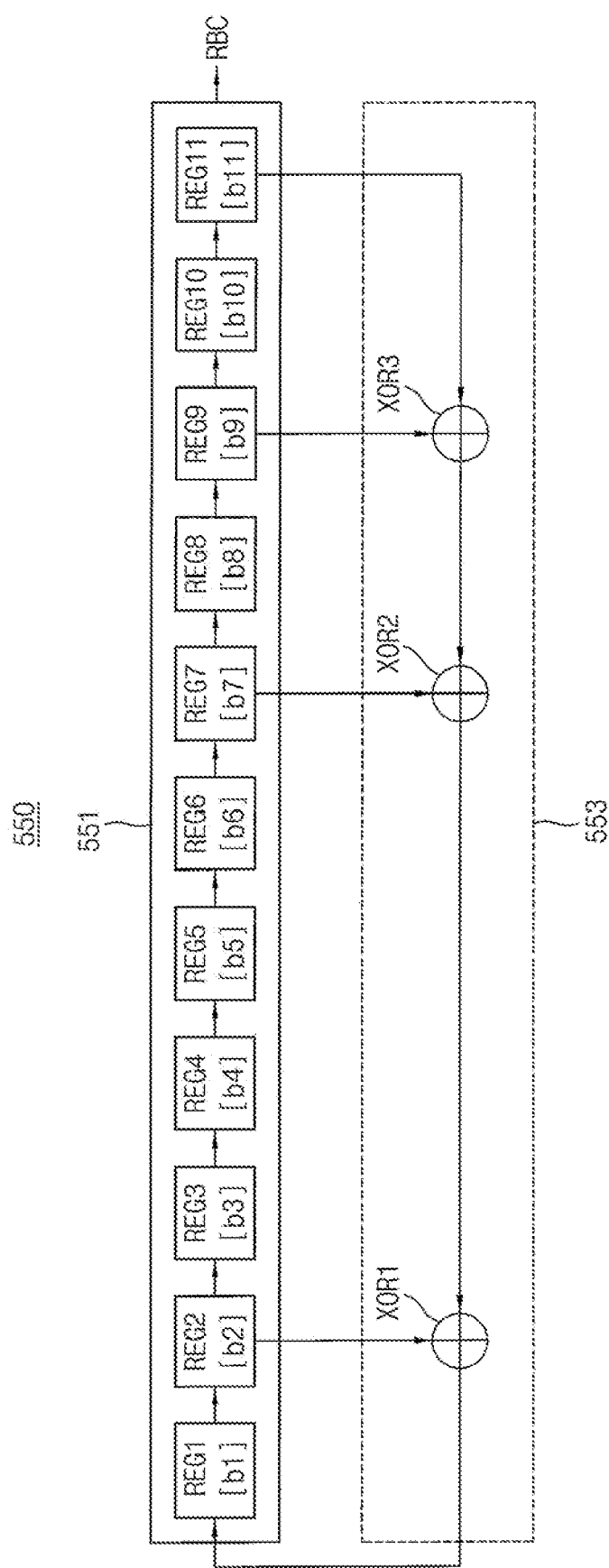
FIG. 8 is a circuit diagram illustrating an example of the random bit generator in FIG. 5 according to an example embodiment.

FIG. 8 is a circuit diagram illustrating an example of the random bit generator in FIG. 5 according to an example embodiment.

Referring to FIG. 8, the random bit generator 550 may include a register circuit 551 and a logical operation circuit 553. The random bit generator 550 may be implemented with a linear feedback shift register. Thus, the register circuit 551 and the logical operation circuit 553 may constitute a linear feedback shift register.

The linear feedback shift register may determine feedback bits based on a characteristic polynomial having a coefficient '0' or '1'. The feedback bits may be output through a feedback path of the linear feedback shift register, and bits, generated by logical operation based on the feedback bits, may be input to input terminals of the linear feedback shift register. The linear feedback shift register may generate a pseudo random sequence based on the bits input to the input terminals.

For example, when the random bit generator 550 is implemented based on a characteristic polynomial of $x^{11}+x^9+x^7+x^2+1$ as illustrated in FIG. 8, the register circuit 551 may include first through eleventh registers REG1~REG11 and the logical operation circuit 553 may include first through third logic circuits XOR1~XOR3.

Each of the first through eleventh registers REG1~REG11 may store respective one of first through eleventh bits b1~b11. Values of the first through eleventh bits b1~b11 may vary according to shift operation. Each of the first through third logic circuits XOR1~XOR3 may perform exclusive OR operation.

The random bit generator 550 may output the random binary code RBC through the register circuit 551. The random bit generator 550 may output the random binary code RBC having a predetermined number of bits. For example, the random bit generator 550 may output the random binary code RBC having five bits based on the first through fifth bits b1~b5 stored in the first through fifth registers REG1~REG5.

The logical operation circuit 553 may be positioned in a feedback path of the random bit generator 550. The first logical circuit XOR1 may be positioned in an output path of the second register REG2, the second logical circuit XOR2 may be positioned in an output path of the seventh register REG7, and the third logical circuit XOR3 may be positioned in output paths of the ninth register REG9 and the eleventh register REG11.

The example in FIG. 8 shows that the third logical circuit XOR3 performs a logical operation based on the ninth bit b9 in the ninth register REG9 and the eleventh bit b11 in the eleventh register REG11. The second logical circuit XOR2 performs a logical operation based on the seventh bit b7 in the seventh register REG7 and an output of the third logical circuit XOR3. The first logical circuit XOR1 performs a logical operation based on the second bit b2 in the second register REG1 and an output of the second logical circuit XOR2.

The output of the first logical circuit XOR1 may vary based on the second bit b2, the seventh bit b7, the ninth bit b9, and the eleventh bit b11. Thus, each of the second bit b2, the seventh bit b7, the ninth bit b9, and the eleventh bit b11 may be a feedback bit. The output of the first logical circuit XOR1 may be provided to the first register REG1 as an input.

The first register REG1 may store the output of the first logical circuit XOR1 as the first bit b1. The bit input through a feedback path may be shifted through the first through eleventh registers REG1~REG11 based on a control signal.

Figure 9:
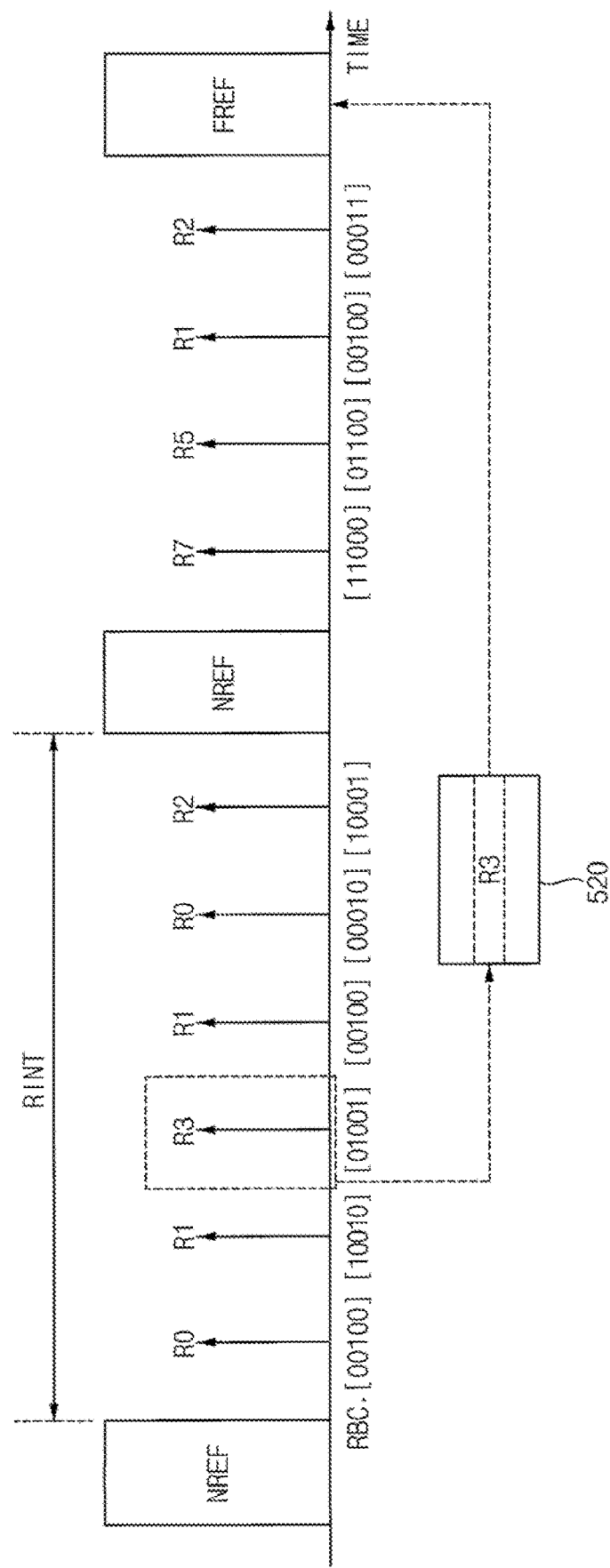
FIG. 9 illustrates an example operation of the row hammer management circuit of FIG. 5 according to an example embodiment.

FIG. 9 illustrates an example operation of the row hammer management circuit of FIG. 5 according to an example embodiment.

In FIG. 9, it is assumed that row addresses R0, R1, R3, R1, R0, and R2 are accessed during a reference time interval RINT between normal refresh operations NREF, and the reference binary code PBC may also be output or accessed during the reference time interval RINT between normal refresh operations NREF. Thus, the reference time interval RINT may correspond to a refresh interval between refresh cycles of the semiconductor memory device 200.

Referring to FIGS. 5 and 9, the random bit generator 550 may generate the random binary code RBC including five bits, and the address capturer 510a may capture the row address R3 accompanied by the active command, in response to the matching signal MTC1 that is activated based on the random binary code RBC having '01001' matching the reference binary code PBC, and store the captured row address R3 in the address storage 520. A hammer refresh operation FREF may be performed on one or more victim memory cell rows physically adjacent to the captured row address R3 stored in the address storage 520 at a refresh timing after row addresses R7, R5, R1, and R2 are accessed after a normal refresh operation NREF is performed.

Figure 10:
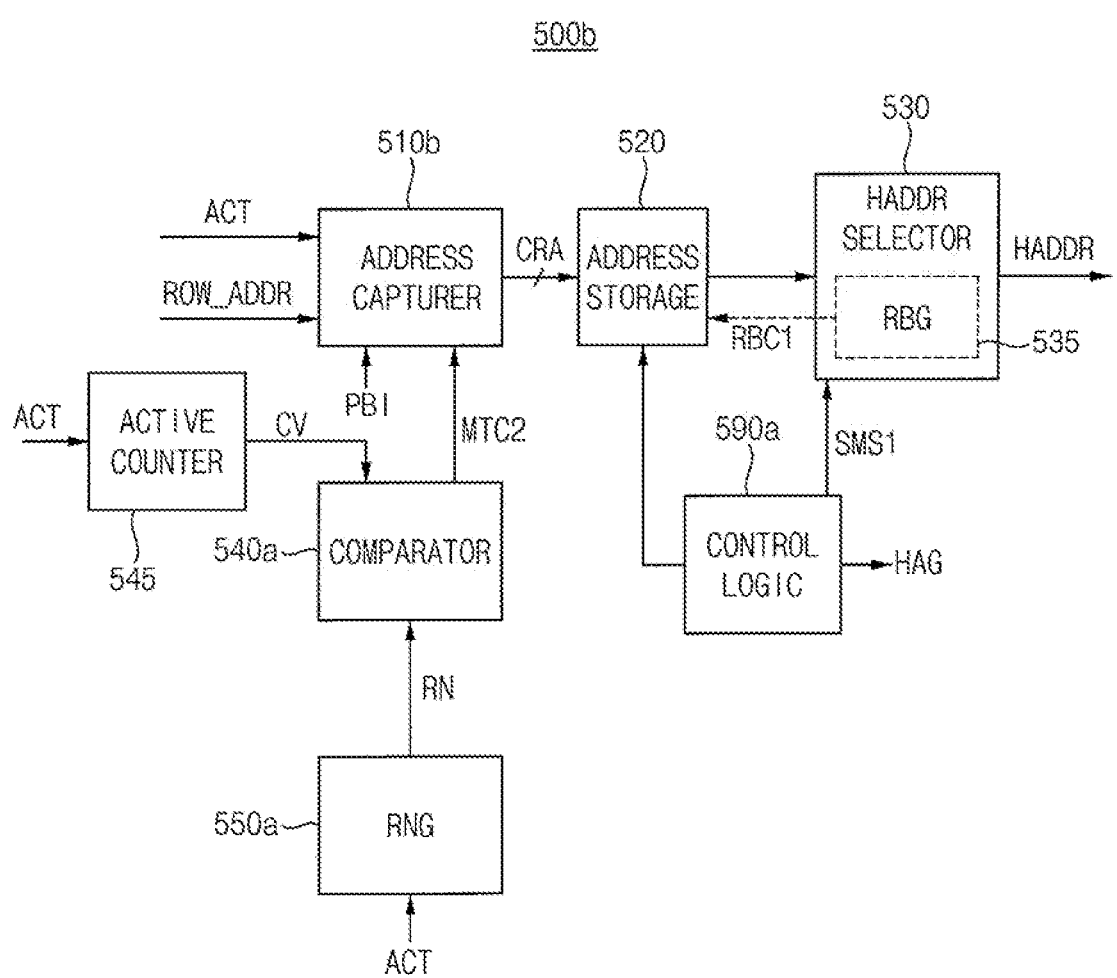
FIG. 10 is a block diagram illustrating an example of the row hammer management circuit in FIG. 3 according to an example embodiment.

FIG. 10 is a block diagram illustrating an example of the row hammer management circuit in FIG. 3 according to an example embodiment.

Referring to FIG. 10, a row hammer management circuit 500b may include an address capturer 510b, an address storage 520, a hammer address (HADDR) selector 530, a comparator 540a, an active counter 545, a random number generator (RNG) 550a, and a control logic 590a.

Operations of the address storage 520, the hammer address, and the control logic 590a are the same as the operations of corresponding components in FIG. 5, and thus descriptions repeated with FIG. 5 will be omitted.

The random number generator 550a may generate a random number RN, which varies randomly, in response to active commands ACT. The random number generator 550a may output the number RN whenever the random number generator 550a receives each of the active commands ACT.

The active counter 545 may count the active commands ACT to output a corresponding counted value CV.

The comparator 540a may compare the random number RN from the random number generator 550a and the counted value CV from the active counter 545, and may output a matching signal MTC2 based on a result of the comparison. The comparator 540a may output the matching signal MTC that is activated in response to the random number RN matching the counted value CV.

The address capturer 510b may receive the row address ROW_ADDR accompanied by the active commands ACT, and may output row addresses accompanied by first active commands randomly selected from the active commands ACT in response to the matching signal MTC2 as captured row addresses CRA. Each of the active commands ACT may have a first selection probability that is uniform based on probability information PBI. Thus, the address capturer 510b may select at least a portion of the active commands ACT with the first selection probability that is uniform based on probability information PBI as the captured row addresses CRA.

Thus, the row hammer management circuit 500b may select a portion of the row addresses ROW_ADDR accompanied by the first active commands ACT which are randomly selected based on the random number RN that varies randomly in response to the active commands ACT matching the counted value CV obtained by counting the active commands ACT as the hammer address HADDR in proportion to a number of access count of each of the first active commands as the hammer address HADDR in proportion to a number of access count of each of the first active commands.

Figure 11:
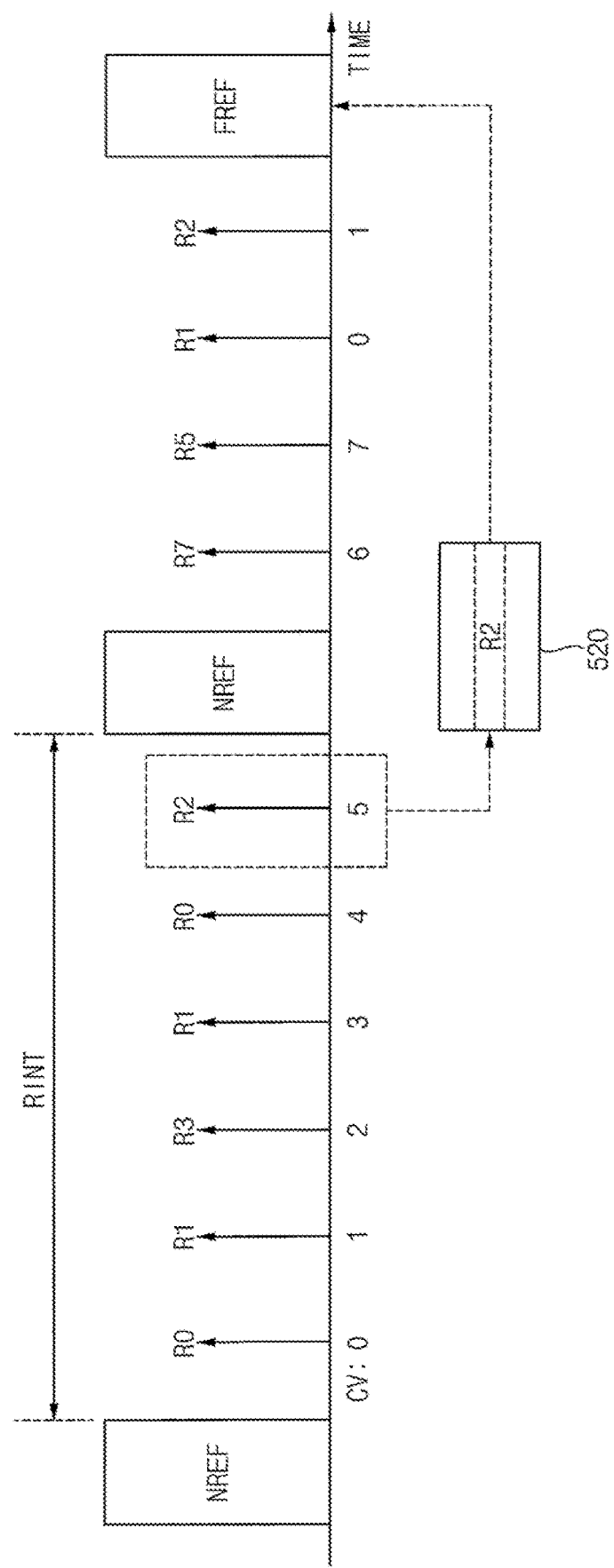
FIG. 11 illustrates an example operation of the row hammer management circuit of FIG. 10 according to an example embodiment.

FIG. 11 illustrates an example operation of the row hammer management circuit of FIG. 10 according to an example embodiment.

In FIG. 11, assuming that the row addresses R0, R1, R3, R1, R0, and R2 are accessed during the reference time interval RINT between normal refresh operations NREF, the counted values with respect to row addresses R0, R1, R3, R1, R0, and R2 correspond to '0', '1', '2', '3', '4', and '5', respectively, and the random number RN corresponds to '5' for convenience of explanation. In this example, the reference time interval RINT corresponds to a refresh interval between refresh cycles of the semiconductor memory device 200.

Referring to FIGS. 10 and 11, the random number generator 550a generates the random number RN corresponding to '5'. The address capturer 510a captures the row address R2 accompanied by the active command, in response to the matching signal MTC2 that is activated based on the counted value CV having '5' matching the random number RN, and stores the captured row address R2 in the address storage 520. A hammer refresh operation FREF may be performed on one or more victim memory cell rows physically adjacent to the captured row address R2 stored in the address storage 520 at a refresh timing after row addresses R7, R5, R1, and R2 are accessed after a normal refresh operation NREF is performed. The counted values CV of the active command with respect to row addresses R7 and R5 may correspond to '6' and '7', respectively.

Figure 12:
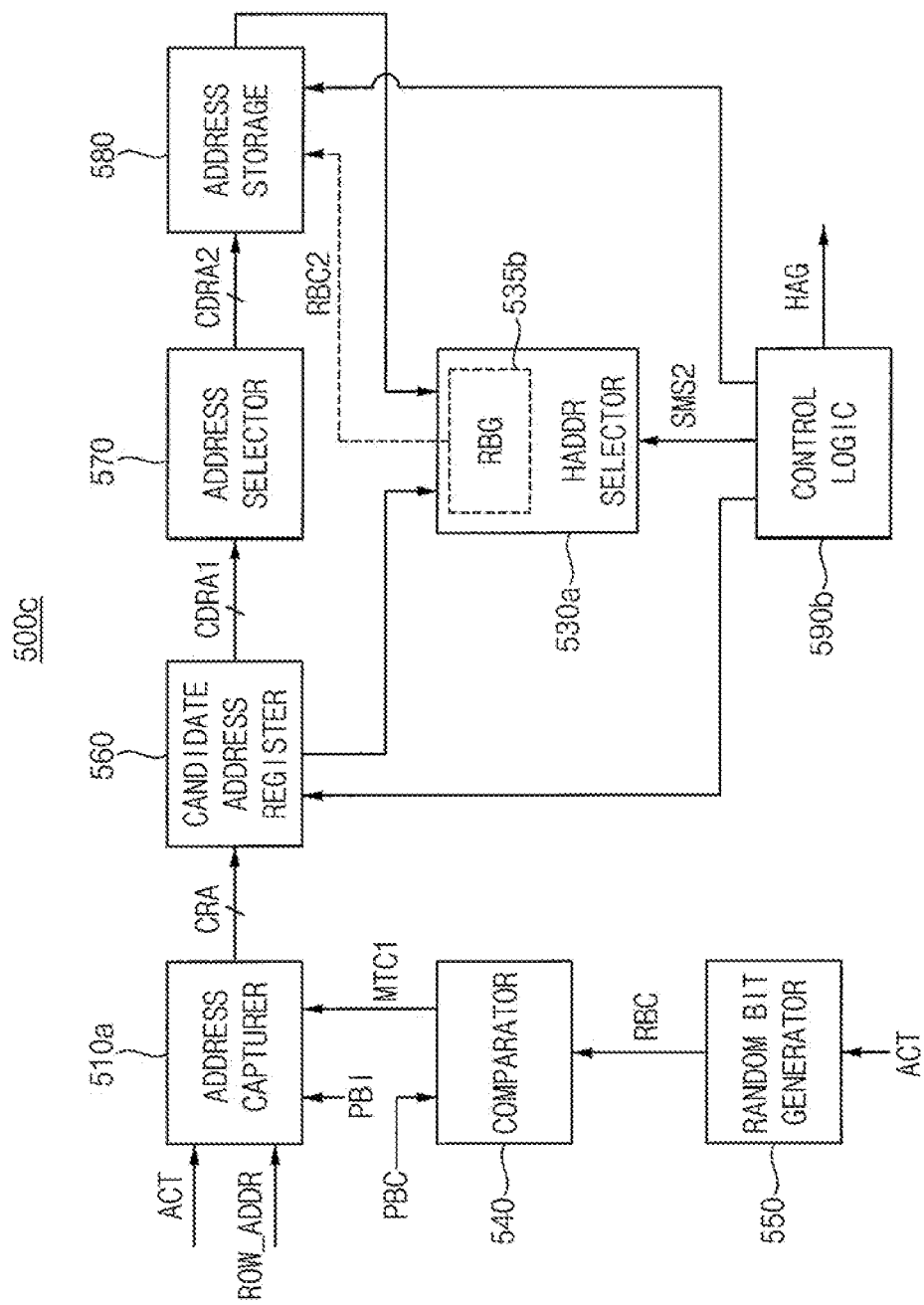
FIG. 12 is a block diagram illustrating an example of the row hammer management circuit in FIG. 3 according to an example embodiment.

FIG. 12 is a block diagram illustrating an example of the row hammer management circuit in FIG. 3 according to an example embodiment.

Referring to FIG. 12, a row hammer management circuit 500c may include an address capturer 510a, a candidate address register 560, an address selector 570, an address storage 580, a hammer address (HADDR) selector 530a, a comparator 540, a random bit generator 550, and a control logic 590b.

The random bit generator 550 may generate a random binary code RBC, which varies randomly, in response to active commands ACT. The random binary code RBC may include a plurality of bits. The random bit generator 550 may output the random binary code RBC whenever the random bit generator 550 receives each of the active commands ACT. The random binary code RBC may be a pseudo random sequence. Thus, the random bit generator 550 may generate the random binary code RBC that is periodically repeated in response to the active commands ACT when the random binary code RBC corresponds to a pseudo random sequence.

The comparator 540 may compare the random binary code RBC and the reference binary code PBC, to output a matching signal MTC1 based on a result of the comparison. The reference binary code PBC may be the same as at least one of values of the random binary code RBC that the random bit generator 540 is capable of outputting.

The address capturer 510a may receive the row address ROW_ADDR accompanied by the active commands ACT, and may output N row addresses accompanied by N first active commands randomly selected from the active commands ACT in response to the matching signal MTC1 as captured row addresses CRA. Here, N is an integer equal to or greater than two. Each of the active commands ACT may have a first selection probability that is uniform based on probability information PBI. Thus, the address capturer 510a may select at least a portion of the active commands ACT with the first selection probability that is uniform based on probability information PBI as the captured row addresses CRA.

The candidate address register 560 may store the captured row addresses CRA as first candidate row addresses CDRA1 sequentially.

The address selector 570 may select a portion of the first candidate row addresses CDRA1 with a uniform probability to output second candidate row addresses CDRA2, in response to the candidate address register 560 being full.

The address storage 580 may store the second candidate row addresses CDRA2 sequentially.

The hammer address selector 530a may select at least one of the second candidate row addresses CDRA2, to output the selected one as the hammer address HADDR. The hammer address selector 530a may be connected to the candidate address register 560 and the address storage 580.

The control logic 590b may control the candidate address register 560, the address storage 580, and the hammer address selector 530a.

The control logic 590b may determine whether each of the candidate address register 560 and the address storage 580 is empty or full, and may control storing operating of the candidate address register 560 and the address storage 580.

The control logic 590b may control a selection mode of the hammer address selector 530a, associated with selecting the hammer address HADDR, by applying a selection mode signal SMS2 to the hammer address selector 530a. The control logic 590b may provide the refresh control circuit 400 in FIG. 3 with a hammer address generation signal HAG indicating that the hammer address selector 530a outputs the hammer address HADDR.

In response to the selection mode signal SMS2 having a first logic level, the hammer address selector 530a may output the second candidate row addresses CDRA2 stored in the address storage 580 as the hammer address HADDR according to an order of being stored in the address storage 580. In response to the selection mode signal SMS1 having a second logic level, the hammer address selector 530a may output the second candidate row addresses CDRA2 stored in the address storage 580 as the hammer address HADDR randomly with a second selection probability that is uniform.

The hammer address selector 530a may include a random bit generator (RBG) 535b therein. The random bit generator 535b may provide the address storage 580 with a random binary code RBC2 in response to the selection mode signal SMS2 having a second logic level. The address storage 580 may provide the hammer address selector 530a with one of the second candidate row addresses CDRA2 in response to the random binary code RBC2.

Thus, hammer address selector 530a may select at least one of the first candidate row addresses CDRA1 stored in the candidate address register 560 to output the selected one as the hammer address HADDR, in response to a refresh management command from the memory controller 30 and in response to the address storage 580 being empty at a timing for performing the hammer refresh operation.

The row hammer management circuit 500c may select the N first active commands from among the active command based on the random binary code RBC that varies randomly in response to the active commands ACT matching the reference binary code PBC, may store the N row addresses accompanied by the N first active commands as first candidate row addresses CDRA1, and may select at least a portion of the first candidate row addresses CDRA1 as the hammer address HADDR.

Figure 13:
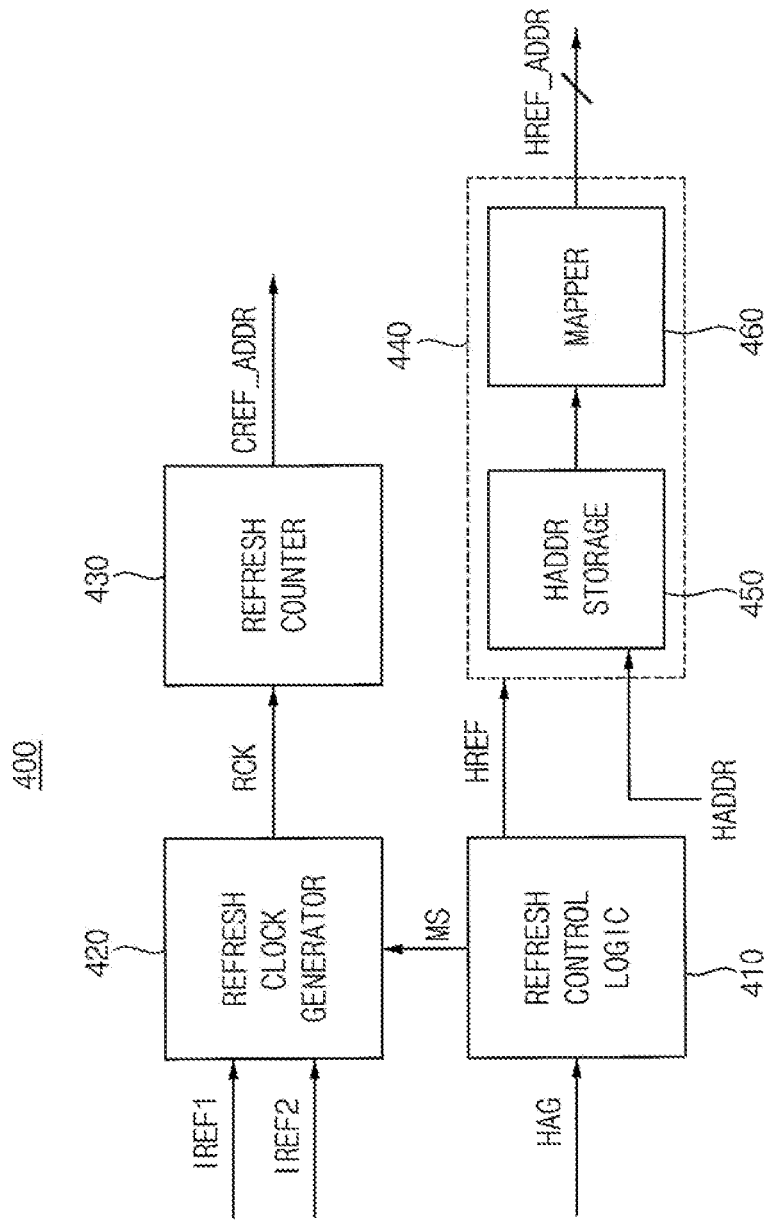
FIG. 13 is a block diagram illustrating an example of the refresh control circuit in FIG. 3 according to an example embodiment.

FIG. 13 is a block diagram illustrating an example of the refresh control circuit in FIG. 3 according to an example embodiment.

Referring to FIG. 13, the refresh control circuit 400 may include a refresh control logic 410, a refresh clock generator 420, a refresh counter 430, and a hammer refresh address generator 440.

The refresh control logic 410 may provide a mode signal MS in response to the hammer address generation signal HAG. The refresh control logic 410 may provide the hammer refresh address generator 440 with a hammer refresh signal HREF to control output timing of the hammer address, in response to one of a first refresh control signal IREF1 and a second refresh control signal IREF2.

The refresh clock generator 420 may generate a refresh clock signal RCK indicating a timing of a normal refresh operation based on the first refresh control signal IREF1, the second refresh control signal IREF2, and the mode signal MS. The refresh clock generator 420 may generate the refresh clock signal RCK in response to the receiving of the first refresh control signal IREF1 or while the second refresh control signal IREF2 is activated.

When the command CMD from the memory controller 30 corresponds to an auto refresh command, the control logic circuit 210 in FIG. 3 may apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh control signal IREF2 to the refresh control circuit 400, and the second refresh control signal IREF2 is activated from a time point when the control logic circuit 210 receives the self-refresh entry command to a time point when control logic circuit 210 receives a self-refresh exit command.

The refresh counter 430 may generate a counter refresh address CREF_ADDR designating sequentially the memory cell rows by performing counting operation at the period of the refresh clock signal RCK, and may provide the counter refresh address CREF_ADDR as the refresh row address REF_ADDR to the row address multiplexer 240 in FIG. 3.

The hammer refresh address generator 440 may include a hammer address storage 450 and a mapper 460.

The hammer address storage 450 may store the hammer address HADDR, and may output the hammer address HADDR to the mapper 460 in response to the hammer refresh signal HREF. The mapper 460 may generate hammer refresh addresses HREF ADDR designating one or more victim memory cell rows physically adjacent to a memory cell row corresponding to the hammer address HADDR.

The hammer refresh address generator 440 may provide the hammer refresh address HREF ADDR as the refresh row address REF_ADDR to the row address multiplexer 240 in FIG. 3.

Figure 14:
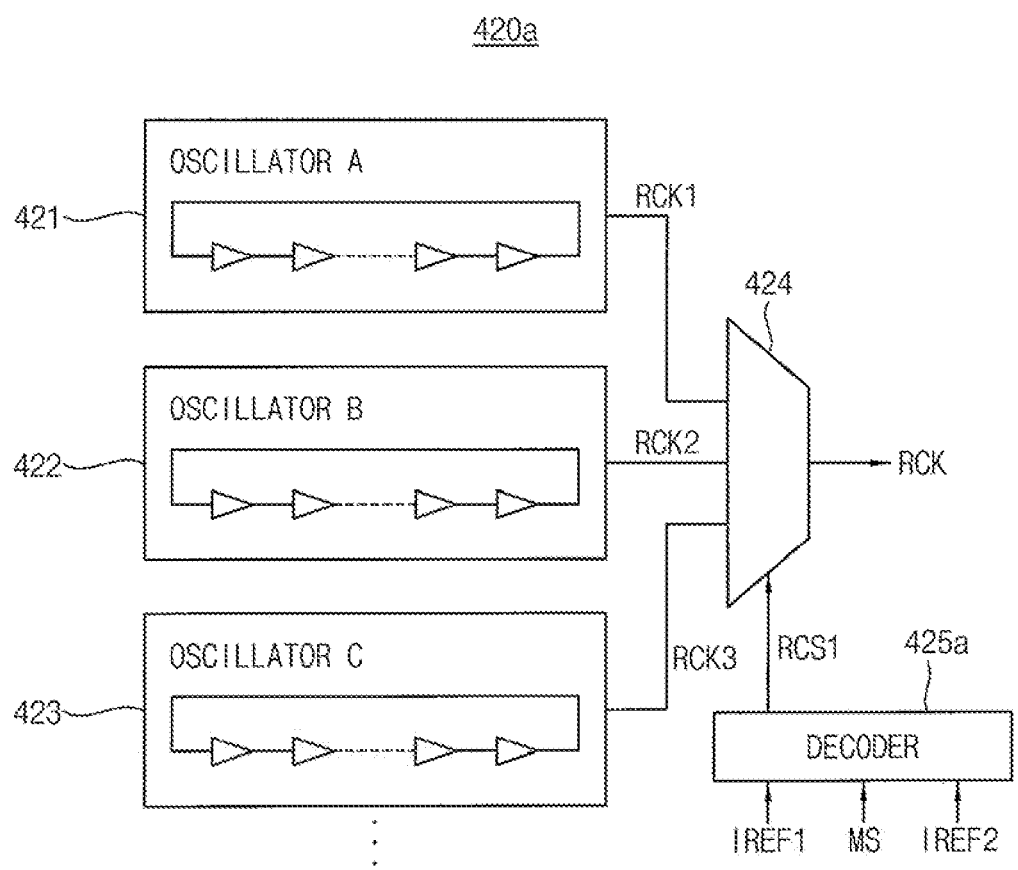
FIG. 14 is a circuit diagram illustrating an example of the refresh clock generator in FIG. 13 according to an example embodiment.

FIG. 14 is a circuit diagram illustrating an example of the refresh clock generator in FIG. 13 according to an example embodiment.

Referring to FIG. 14, a refresh clock generator 420*a* may include a plurality of oscillators 421, 422, and 423, a multiplexer 424, and a decoder 425*a*.

The decoder 425*a* may decode the first refresh control signal IREF1, the second refresh control signal IREF2, and the mode signal MS, to output a clock control signal RCS1.

The oscillators 421, 422, and 423 may generate refresh clock signals RCK1, RCK2, and RCK3 having different periods.

The multiplexer 424 may select one of the refresh clock signals RCK1, RCK2, and RCK3, to provide the refresh clock signal RCK in response to the clock control signal RCS1.

Because the mode signal MS indicates that the hammer address is generated, the refresh clock generator 420*a* may adjust a refresh cycle by selecting one of the refresh clock signals RCK1, RCK2, and RCK3.

Figure 15:
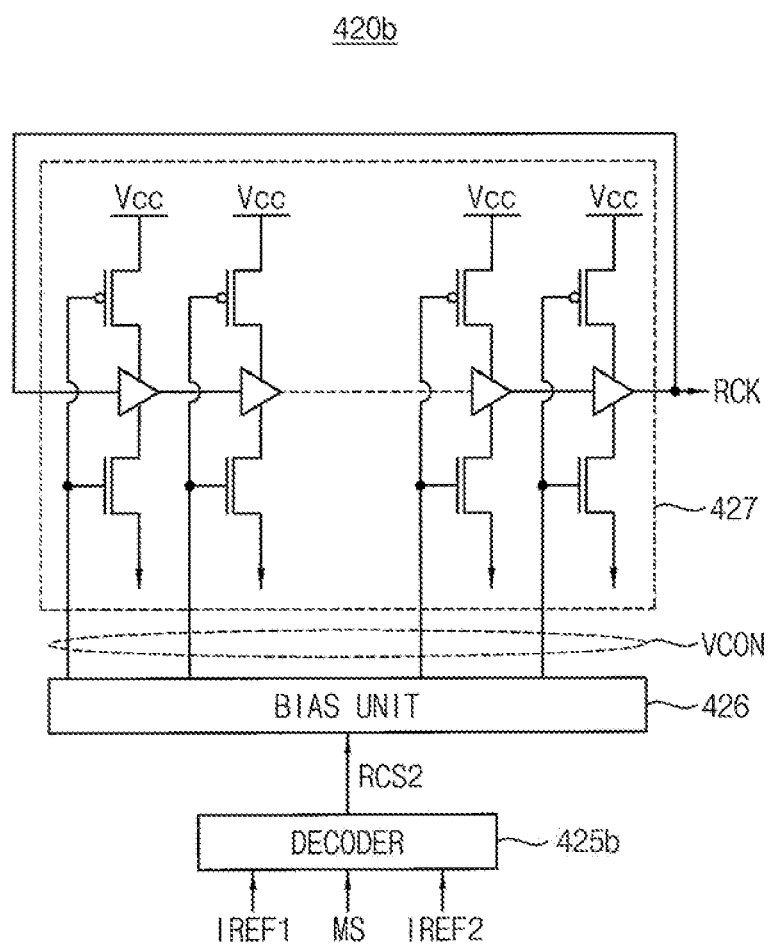
FIG. 15 is a circuit diagram illustrating another example of the refresh clock generator in FIG. 13 according to an example embodiment.

FIG. 15 is a circuit diagram illustrating another example of the refresh clock generator in FIG. 13 according to an example embodiment.

Referring to FIG. 15, a refresh clock generator 420*b* may include a decoder 425*b*, a bias unit 426, and an oscillator 427.

The decoder 425*b* may decode the first refresh control signal IREF1, the second refresh control signal IREF2, and the mode signal MS, to output a clock control signal RCS2.

The bias unit 426 may generate a control voltage VCON in response to the clock control signal RCS2.

The oscillator 427 may generate the refresh clock signal RCK having a variable period, according to the control voltage VCON.

Because the mode signal MS indicates that the hammer address is generated, the refresh clock generator 420*b* may adjust a refresh cycle by varying a period of the refresh clock signal RCK based on the clock control signal RCS2.

Figure 16:
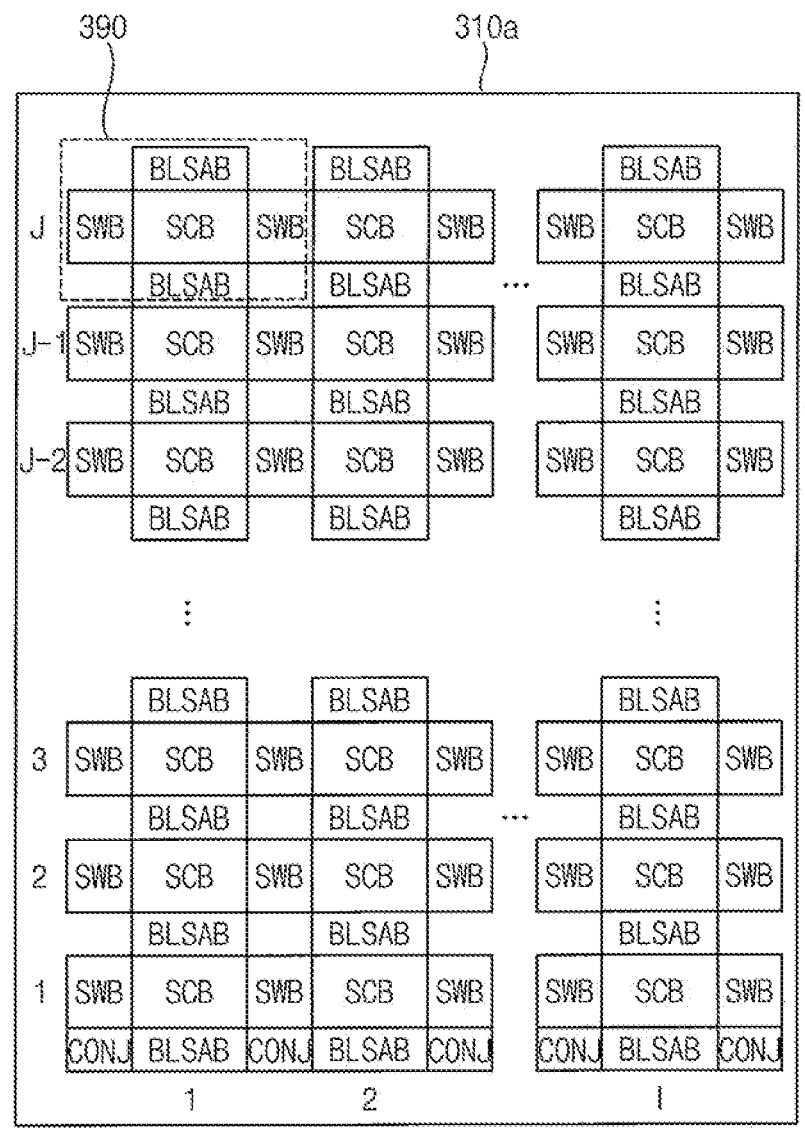
FIG. 16 illustrates an example of the first bank array in the semiconductor memory device of FIG. 3 according to an example embodiment.

FIG. 16 illustrates an example of the first bank array in the semiconductor memory device of FIG. 3 according to an example embodiment.

Referring to FIG. 16, in the first bank array 310*a*, I sub-array blocks SCB may be disposed in the first direction D1, and J sub-array blocks SCB may be disposed in the second direction D2 substantially perpendicular to the first direction D1. I and J represent a number of the sub-array blocks SCB in the first direction D1 and the second direction D2, respectively, and may be natural numbers greater than two.

The I sub-array blocks SCB disposed in the first direction D1 in one row may be referred to as a row block. A plurality of bit-lines, a plurality of word-lines, and a plurality of memory cells connected to the bit-lines and the word-lines may be disposed in each of the sub-array blocks SCB.

I+1 sub word-line driver regions SWB may be disposed in the first direction D1, e.g., between the sub-array blocks SCB in the first direction D1 as well on each side of each of the sub-array blocks SCB. Sub word-line drivers may be disposed in the sub word-line driver regions SWB.

J+1 bit-line sense amplifier regions BLSAB may be disposed in the second direction D2, e.g., between the sub-array blocks SCB in the second direction D2 and above and below each of the sub-array blocks SCB. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator may be disposed in each of the conjunction regions CONJ.

An example of a portion 390 in the first bank array 310*a* will now be described with reference to FIG. 17 below.

Figure 17:
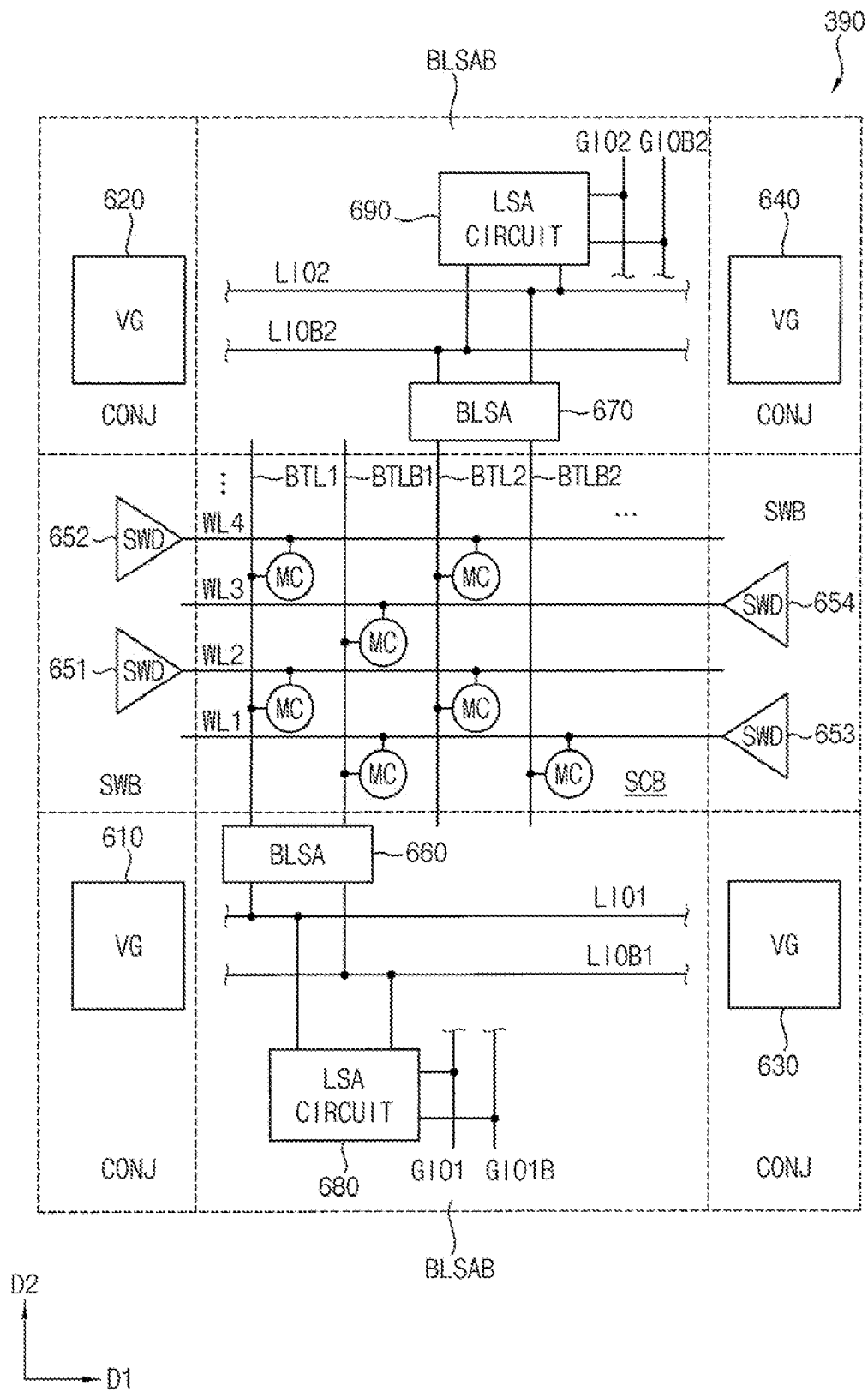
FIG. 17 illustrates a portion of the first bank array in FIG. 16 according to an example embodiment.

FIG. 17 illustrates the portion 390 of the first bank array 310*a* in FIG. 16 according to an example embodiment.

Referring to FIGS. 16 and 17, in the portion 390 of the first bank array 310*a*, the sub-array block SCB, two of the bit-line sense amplifier regions BLSAB, two of the sub word-line driver regions SWB, and four of the conjunction regions CONJ are disposed.

The sub-array block SCB includes a plurality of word-lines WL1~WL4 extending in a row direction (the first direction D1), and a plurality of bit-line pairs BTL1~BTLB1 and BTL2~BTLB2 extending in a column direction (the second direction D2). The sub-array block SCB includes a plurality of memory cells MCs disposed at intersections of the word-lines WL1~WL4 and the bit-line pairs BTL1~BTLB1 and BTL2~BTLB2.

With reference to FIG. 17, the sub word-line driver regions SWB include a plurality of sub word-line drivers SWDs 651, 652, 653, and 654 that respectively drive the word-lines WL1~WL4. The sub word-line drivers 651 and 652 may be disposed in the sub word-line driver region SWB, which is leftward (in this example), with respect to the sub-array block SCB. The sub word-line drivers 653 and 654 may be disposed in the sub word-line driver region SWB, which is rightward (in this example), with respect to the sub-array block SCB.

The bit-line sense amplifier regions BLSAB may include bit-line sense amplifiers 660 (BLSA) and bit-line sense amplifier 670 coupled to the bit-line pairs BTL1~BTLB1 and BTL2~BTLB2, and local sense amplifier circuit 680 and local sense amplifier circuit 690. The bit-line sense amplifier 660 may sense and amplify a voltage difference between the bit-line pair BTL1 and BTLB1, to provide the amplified voltage difference to a local I/O line pair LIO1 and LIOB1.

The local sense amplifier circuit 680 may control connection between the local I/O line pair LIO1 and LIOB1 and a global I/O line pair GIO1 and GIOB1. The local sense amplifier circuit 690 may control connection between the local I/O line pair LIO2 and LIOB2 and a global I/O line pair GIO2 and GIOB2.

Referring to FIG. 17, the bit-line sense amplifier 660 and the bit-line sense amplifier 670 may be alternately disposed at an upper portion and a lower portion of the sub-array block SCB. The conjunction regions CONJ may be disposed adjacent to the bit-line sense amplifier regions BLSAB and the sub word-line driver regions SWB. The conjunction regions CONJ may be disposed at each corner of the sub-array block SCB in FIG. 17. A plurality of voltage generators 610, 620, 630, and 640 may be disposed in the conjunction regions CONJ.

FIGS. 18 and 19 illustrate example commands which may be used in the memory system of FIG. 1.

FIG. 18 illustrates combinations of a chip selection signal CS_n and first through fourteenth command-address signals CA0~CA13 representing an active command ACT, a write command WR, and a read command RD. FIG. 19 illustrates combinations of the chip selection signal CS_n and the first through fourteenth command-address signals CA0~CA13 representing precharge commands PREab, PREsb, and PREpb.

In FIGS. 18 and 19, H indicates the logic high level, L indicates the logic low level, V indicates a valid logic level corresponding to one of the logic high level and the logic low level, R0~R17 indicate bits of a row address, BA0 through BA2 indicate bits of a bank address, and CID0 through CID3 indicate die identifiers of a memory die when the semiconductor memory device 200 is implemented with a stacked memory device including a plurality of memory dies. In FIG. 14, C2~C10 indicate bits of a column address. In FIG. 18, BL indicates burst length flag.

Referring to FIG. 18, the active command ACT, the write command WR, and the read command RD may be transferred during two cycles, e.g., during a high level and a low level of the chip selection signal CS_n. The active command ACT a may include the bank address bits BA0 and BA1 and the row address bits R0~R17.

In FIG. 19, PREpb is a precharge command to precharge a particular bank in a particular bank group, PREab is all bank precharge command to precharge all banks in all bank groups, and PREsb is same bank precharge command to precharge a same bank in all bank groups.

Referring to FIG. 19, the ninth command-address signal CA8 or the tenth command-address signal CA9 of each of the precharge commands PREab and PREsb may be used as a flag to determine the hammer address.

Figure 20:
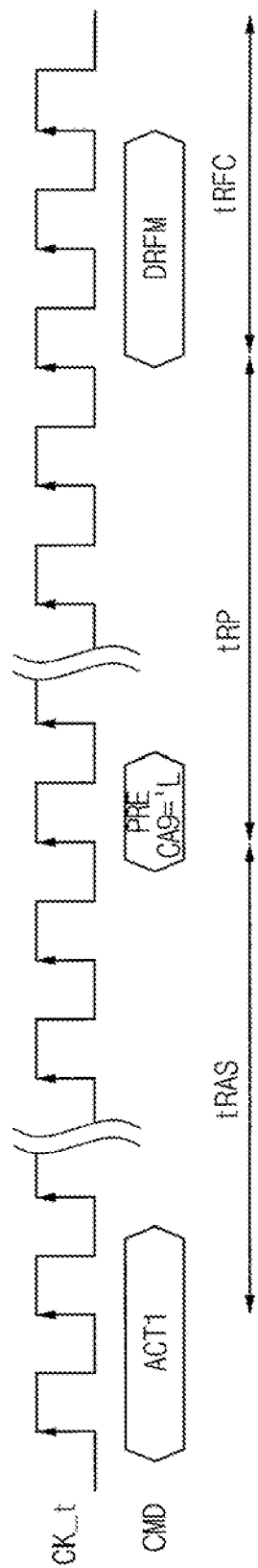
FIG. 20 illustrates an example of the command protocol of the memory system when the memory system determines a hammer address based on the precharge command.

FIG. 20 illustrates an example of the command protocol of the memory system when the memory system determines a hammer address based on the precharge command.

Referring to FIGS. 1, 2, 19, and 20, the scheduler 55 may apply the first active command ACT1 to the semiconductor memory device 200 in synchronization with an edge of the clock signal CK_t, and apply the precharge command PRE designating whether a target memory cell row designated by a target row address corresponds to a hammer address, which is accompanied by the first active command ACT1, to the semiconductor memory device 200 after a tRAS corresponding to active to precharge time elapses. The scheduler 55 may set the tenth command-address signal CA9 of the precharge command PRE to a logic low level.

After a time interval corresponding to precharge time tRP, the scheduler 55 may apply a second active command ACT2 to the semiconductor memory device 200 in synchronization with an edge of the clock signal CK_t, and apply a direct refresh management command DRFM to the semiconductor memory device 200. The semiconductor memory device 200 may perform a hammer refresh operation on one or more victim memory cell rows physically adjacent to a memory cell row corresponding to the hammer address HADDR during a refresh cycle tRFC, in response to the direct refresh management command DRFM. During the refresh cycle interval tRFC, generating other commands may be inhibited from a time point at the semiconductor memory device 200 receiving the direct refresh management command DRFM.

Figure 21:
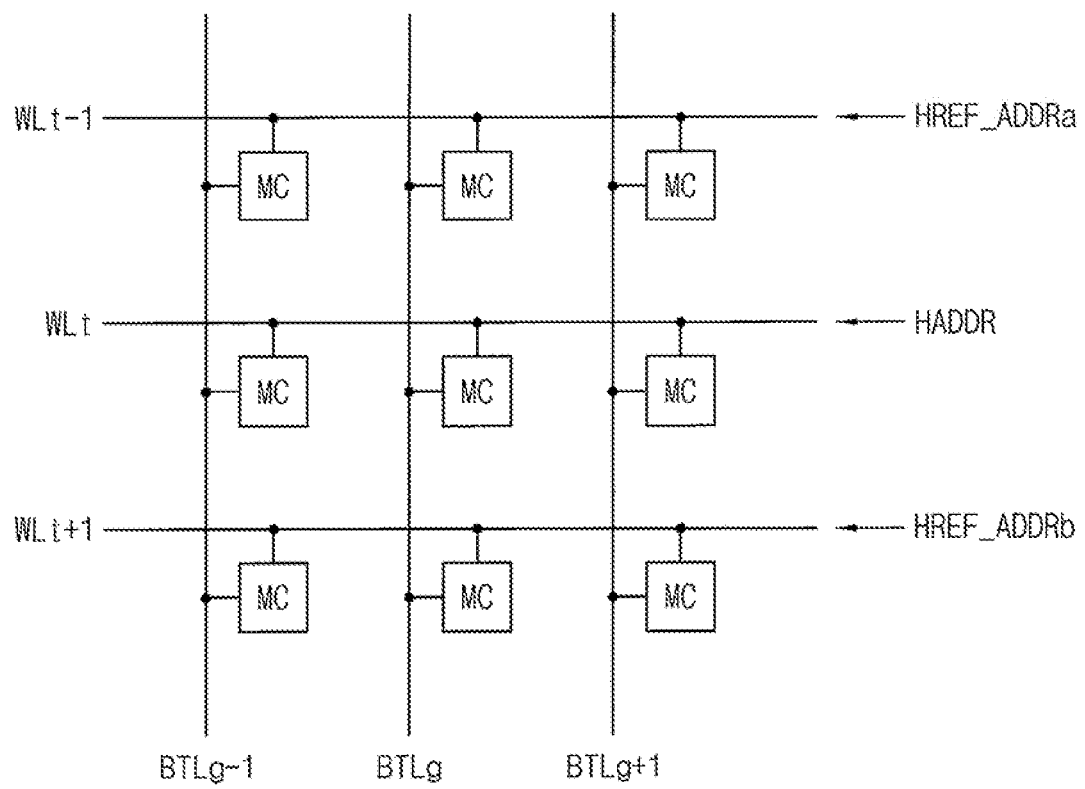
FIG. 21 is a diagram illustrating a portion of a memory cell array for describing generation of hammer refresh addresses.

FIG. 21 is a diagram illustrating a portion of a memory cell array for describing generation of hammer refresh addresses.

FIG. 21 illustrates three word-lines WLt−1, WLt, and WLt+1, three bit-lines BTLg−1, BTLg, and BTLg+1, and memory cells MC coupled to the word-lines WLt−1, WLt, and WLt+1 and the bit-lines BTLg−1, BTLg, and BTLg+1 in the memory cell array. The three word-lines WLt−1, WLt, and WLt+1 are extended in a row direction (e.g., the first direction D1) and arranged sequentially along a column direction (e.g., the second direction D2). The three bit-lines BTLg−1, BTLg, and BTLg+1 are extended in the column direction and arranged sequentially along the row direction. It will be understood that the word-lines WLt−1 and WLt are physically directly adjacent to each other since there are no intervening word-lines between the word-lines WLt−1 and WLt.

By way of example, it may be assumed that the middle word-line WLt may correspond to the hammer address HADDR that has been intensively accessed. It will be understood that "an intensively-accessed word-line" refers to a word-line that has a relatively higher activation number and/or has a relatively higher activation frequency. Whenever the hammer word-line (e.g., the middle word-line WLt) is accessed, the hammer word-line WLt is enabled and precharged, and the voltage level of the hammer word-line WLt is increased and decreased. Word-line coupling may cause the voltage levels of the adjacent word-lines WLt−1 and WLt+1 to fluctuate as the voltage level of the hammer word-line WLt varies, and thus the cell charges of the memory cells MC coupled to the adjacent word-lines WLt−1 and WLt+1 may be affected. As the hammer word-line WLt is accessed more frequently, the cell charges of the memory cells MC coupled to the adjacent word-lines WLt−1 and WLt+1 may be lost more rapidly.

The hammer refresh address generator 440 in FIG. 13 may provide the hammer refresh address HREF_ADDR representing the addresses HREF_ADDRa and HREF_ADDRb of the rows (e.g., the word-lines WLt−1 and WLt+1) that are physically adjacent to the row of the hammer address HADDR (e.g., the middle word-line WLt). A refresh operation for the adjacent word-lines WLt−1 and WLt+1 may be performed additionally based on (e.g., in response to) the hammer refresh address HREF_ADDR to reduce or prevent the loss of data stored in the memory cells MC.

Figure 22:
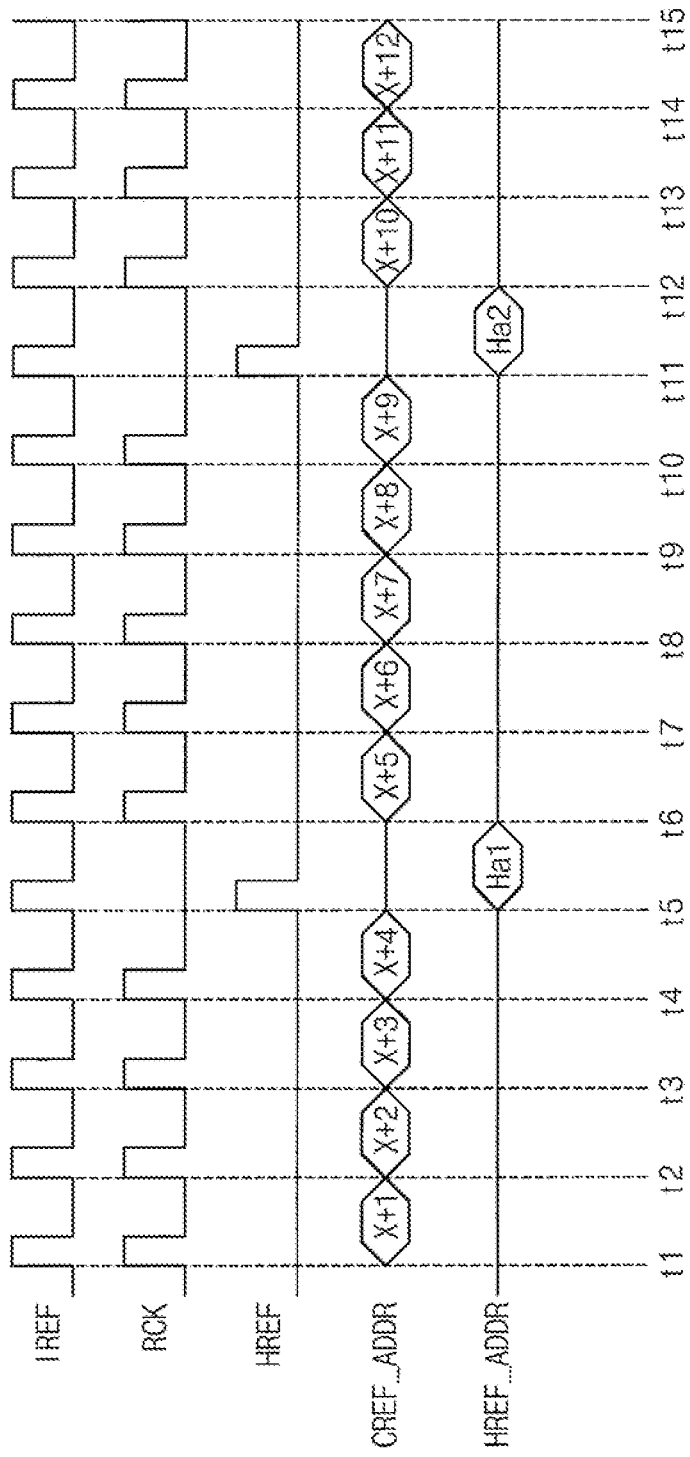
FIGS. 22 and 23 are timing diagrams illustrating example operations of a refresh control circuit of FIG. 13 according to an example embodiment.
Figure 23:
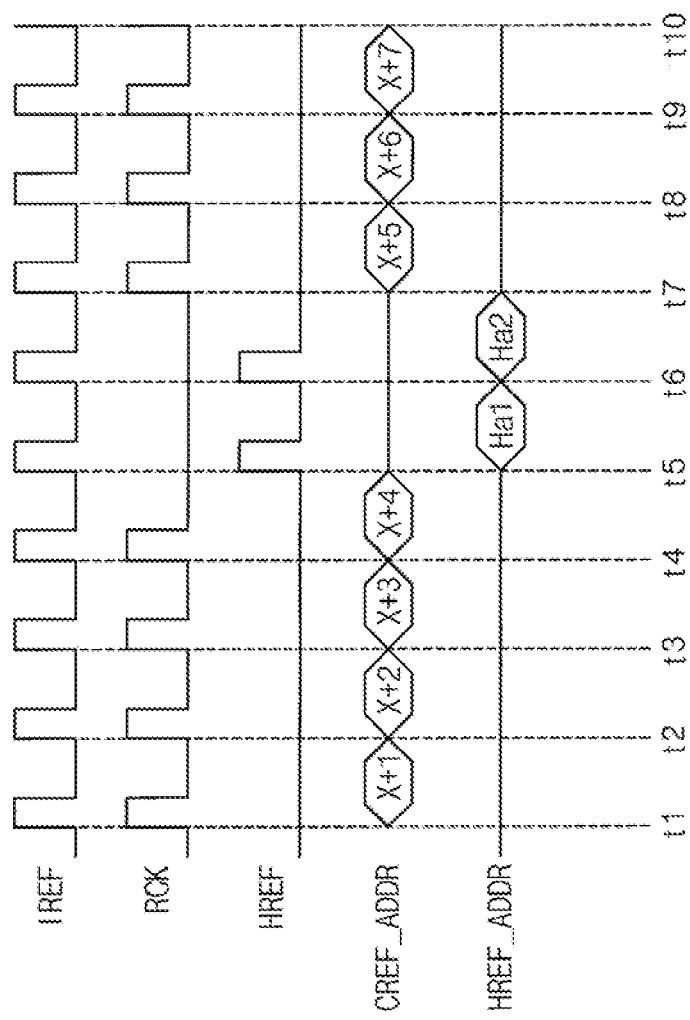

FIGS. 22 and 23 are timing diagrams illustrating example operations of a refresh control circuit of FIG. 13 according to an example embodiment.

FIGS. 22 and 23 illustrate generations of a refresh clock signal RCK, a hammer refresh signal HREF, a counter refresh address CREF_ADDR, and a hammer refresh address HREF_ADDR, with respect to a refresh control signal IREF that is activated in a pulse shape. The intervals between the activation time points t1~t15 of the refresh control signal IREF may be regular or irregular.

Referring to FIGS. 13 and 22, the refresh control logic 410 may activate the refresh clock signal RCK in synchronization with some time points t1~t4, t6~t10, and t12~t15 among the activation time points t1~t15 of the refresh control signal IREF, and may activate the hammer refresh signal HREF with the other time points t5 and t11.

The refresh counter 430 may generate the counter refresh address CREF_ADDR representing the sequentially changing addresses X+1~X+15 in synchronization with the activation time points t1~t4, t6~t10, and t12~t15 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t11 of the hammer refresh signal HREF.

Referring to FIGS. 13 and 23, the refresh control logic 410 may activate the refresh clock signal RCK in synchronization with some time points t1~t4 and t7~t10 among the activation time points t1~t10 of the refresh control signal IREF, and may activate the hammer refresh signal HREF with the other time points t5 and t6.

The refresh counter 430 may generate the counter refresh address CREF_ADDR representing the sequentially changing addresses X+1~X+7 in synchronization with the activation time points t1~t4 and t7~t10 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the hammer refresh signal HREF.

Figure 24:
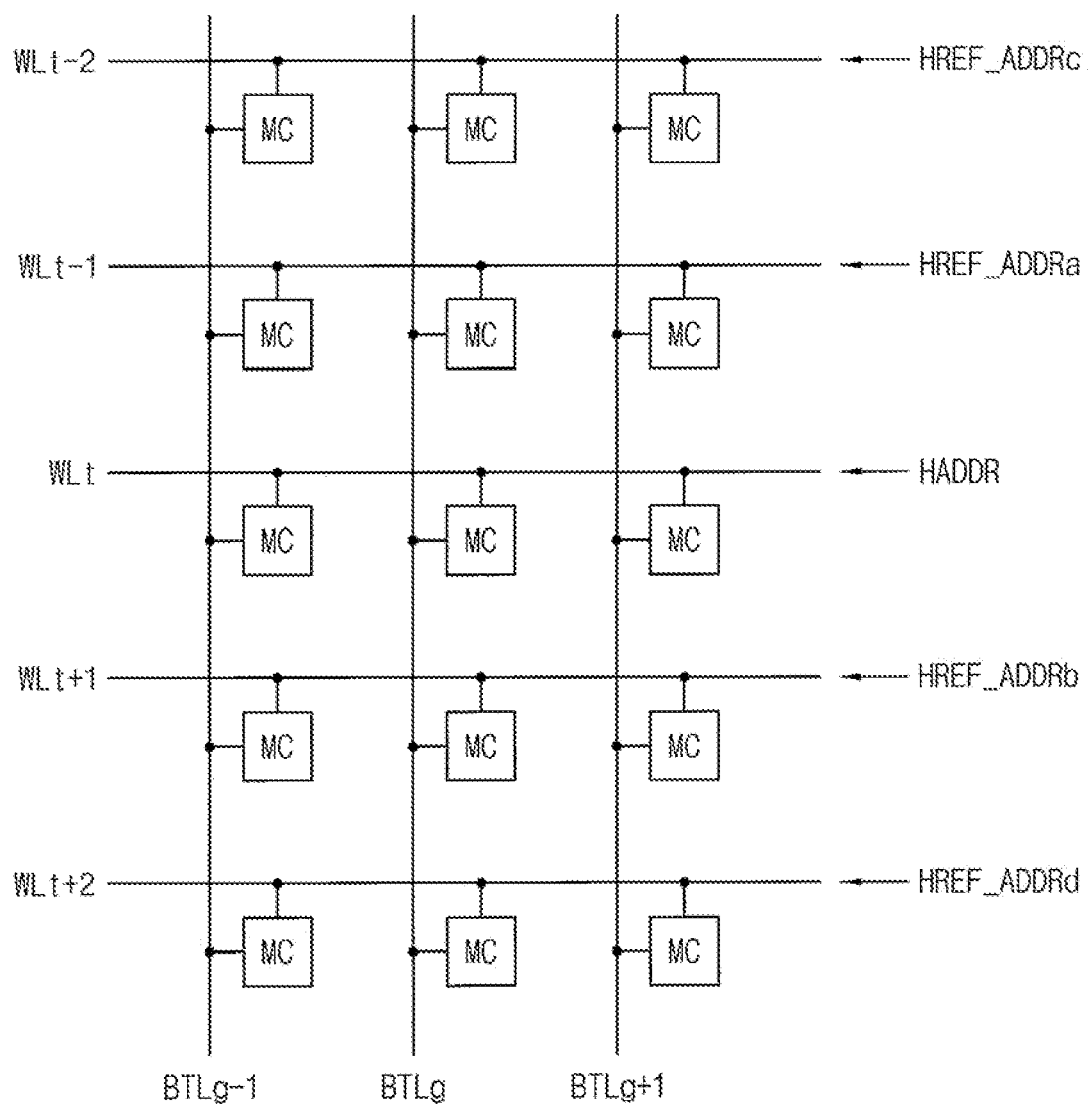
FIG. 24 is a diagram illustrating a portion of a memory cell array for describing generation of hammer refresh addresses.

FIG. 24 is a diagram illustrating a portion of a memory cell array for describing generation of hammer refresh addresses.

FIG. 24 illustrates five word-lines WLt−2, WLt−1, WLt, WLt+1, and WLt+2, three bit-lines BTLg−1, BTLg, and BTLg+1, and memory cells MC coupled to the word-lines WLt−2, WLt−1, WLt, WLt+1, and WLt+2 and the bit-lines BTLg−1, BTLg, and BTLg+1 in the memory cell array. The five word-lines WLt−2, WLt−1, WLt, WLt+1, and WLt+2 are extended in a row direction and arranged sequentially along a column direction.

The hammer refresh address generator 440 in FIG. 13 may provide the HREF_ADDR representing addresses HREF_ADDRa, HREF_ADDRb, HREF_ADDRc, and HREF_ADDRd of the rows (e.g., the word-lines WLt−2, WLt−1, WLt+1, and WLt+1) that are physically adjacent to the row of the hammer address HADDR (e.g., the middle word-line WLt). A refresh operation for the adjacent word-lines WLt−2, WLt−1, WLt+1, and WLt+1 may be performed additionally based on (e.g., in response to) the hammer refresh address HREF_ADDR, to reduce or prevent the loss of data stored in the memory cells MC.

Figure 25:
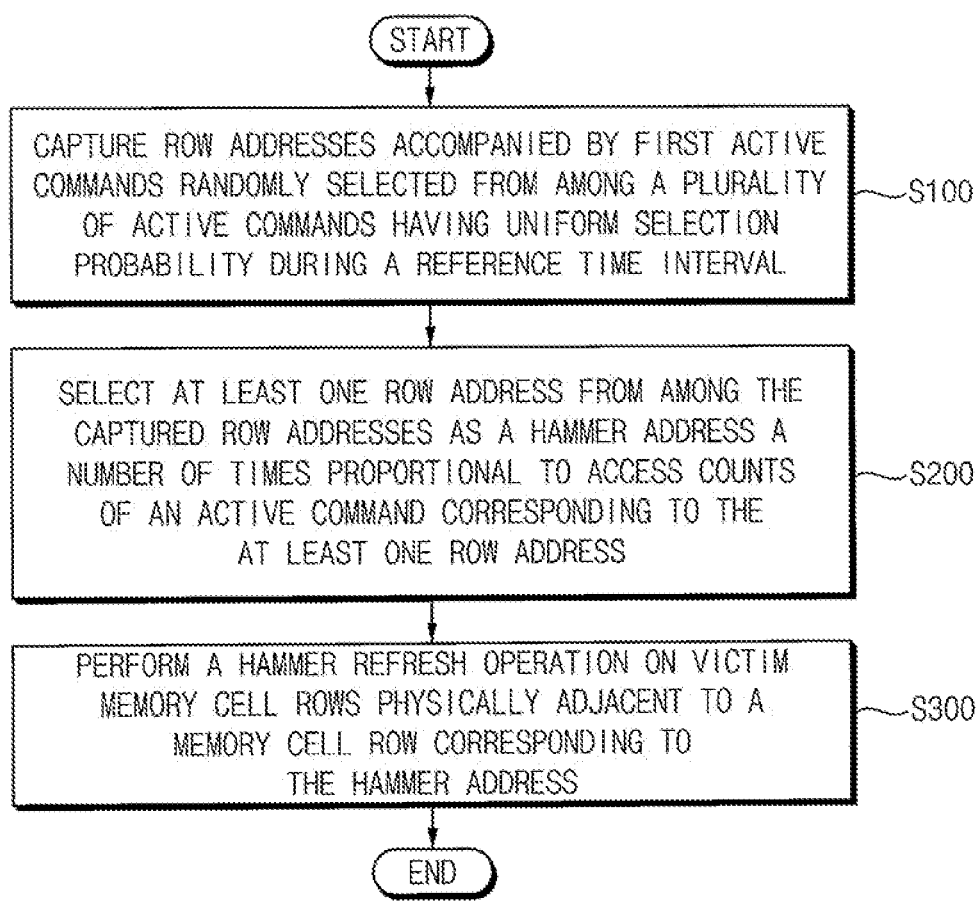
FIG. 25 is a flow chart illustrating a method of operating a semiconductor memory device according to an example embodiment.

FIG. 25 is a flow chart illustrating a method of operating a semiconductor memory device according to an example embodiment.

Referring to FIGS. 3 through 25, an example embodiment may provide a method of operating a semiconductor memory device 200, which include a memory cell array 310 that includes a plurality of memory cell rows, each of which includes a plurality of volatile memory cells, in which a row hammer management circuit 500 captures row addresses accompanied by first active commands randomly selected from active commands, each having a first selection probability that is uniform, from an external memory controller 30 during a reference time interval RINT (operation S100).

The row hammer management circuit 500 selects at least one row address from among the captured row addresses as a hammer address HADDR a number of times proportional to access counts of an active command corresponding to the at least one row address during the reference time interval RINT (operation S200).

A refresh control circuit 400 performs a hammer refresh operation on one or more victim memory cell rows which are physically adjacent to a memory cell row corresponding to the hammer address HADDR (operation S300).

Accordingly, in the semiconductor memory device and the method of operating the semiconductor memory device, the row hammer management circuit 500 generates the hammer address a number of times proportional to access counts of an active command corresponding to at least one row address based on the row addresses accompanied by first active commands randomly selected from active commands having a uniform selection probability that is uniform during a reference time interval, and the refresh control circuit 400 performs a hammer refresh operation on one or more victim memory cell rows which are physically adjacent to a memory cell row corresponding to the hammer address. Therefore, the semiconductor memory device may prevent a row hammer generated by non-uniform attack pattern such as Blacksmith.

Figure 26:
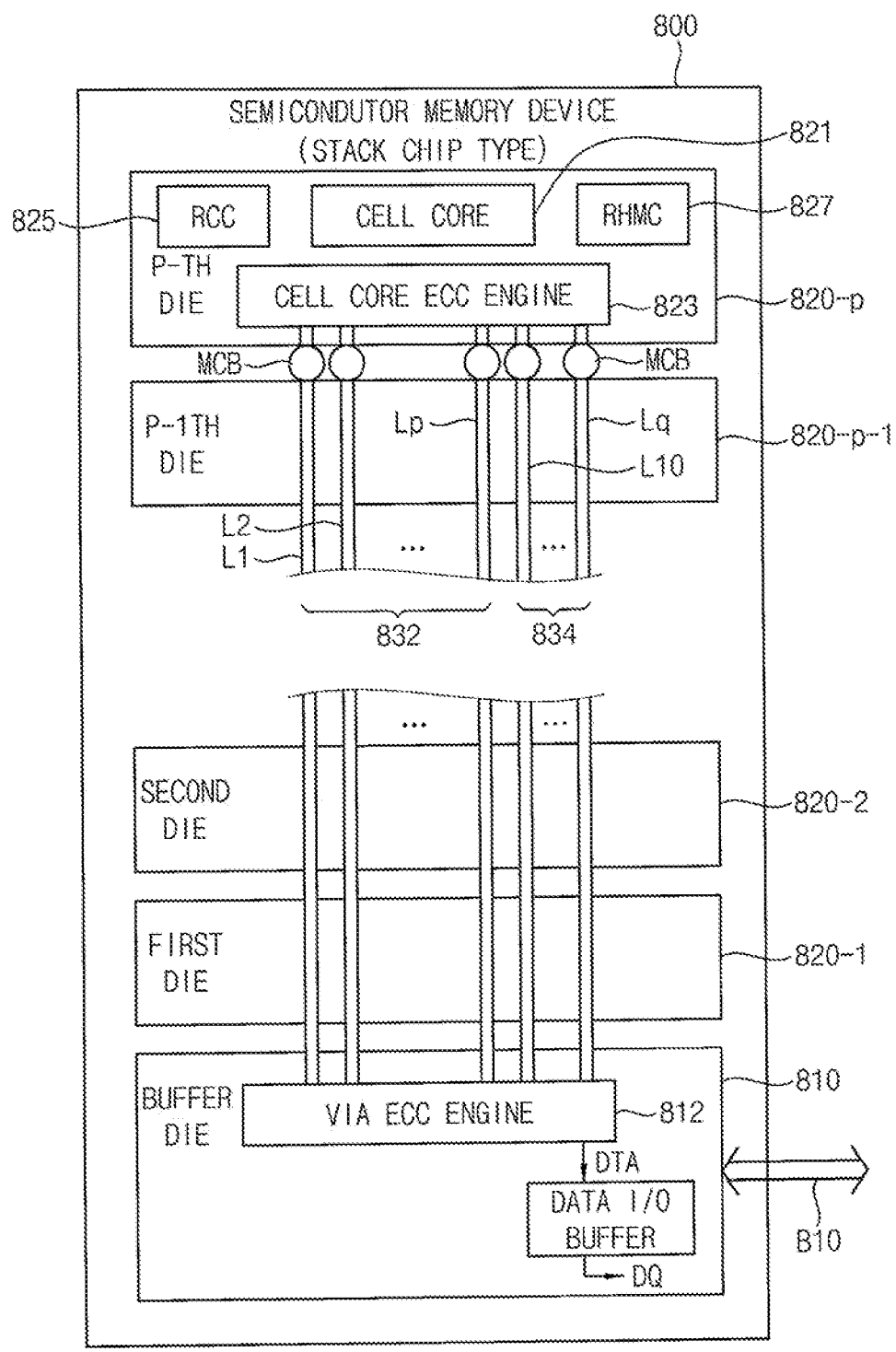
FIG. 26 is a block diagram illustrating a semiconductor memory device according to an example embodiment.

FIG. 26 is a block diagram illustrating a semiconductor memory device according to an example embodiment.

Referring to FIG. 26, a semiconductor memory device 800 may include at least one buffer die 810 and a plurality of memory dies 820-1 to 820-p (p is a natural number equal to or greater than three) providing a soft error analyzing and correcting function in a stacked chip structure.

The plurality of memory dies 820-1 to 820-p may be stacked on the buffer die 810 and may convey data through a plurality of through silicon via (TSV) lines.

Each of the plurality of memory dies 820-1 to 820-p may include a cell core 821 to store data, a cell core ECC engine 823 which generates transmission parity bits (i.e., transmission parity data) based on transmission data to be sent to the at least one buffer die 810, a refresh control circuit (RCC) 825, and a row hammer management circuit (RHMC) 827. The cell core 821 may include a plurality of memory cells having a DRAM cell structure.

The refresh control circuit 825 may employ the refresh control circuit 400 of FIG. 13.

The row hammer management circuit 827 may employ one of the row hammer management circuit 500a of FIG. 5, the row hammer management circuit 500b of FIG. 10, and the row hammer management circuit 500b of FIG. 12.

The row hammer management circuit 827 may generate the hammer address a number of times proportional to access counts of an active command corresponding to at least one row address based on the row addresses accompanied by first active commands randomly selected from active commands having a uniform selection probability that is uniform during a reference time interval, and the refresh control circuit 825 may perform a hammer refresh operation on one or more victim memory cell rows which are physically adjacent to a memory cell row corresponding to the hammer address.

The buffer die 810 may include a via ECC engine 812, which may correct a transmission error using the transmission parity bits when a transmission error is detected from the transmission data received through the TSV liens and generate error-corrected data.

The buffer die 810 may include a data I/O buffer 816. The data I/O buffer 816 may generate the data signal DQ by sampling the data DTA from the via ECC engine 812, and may output the data signal DQ to the outside.

The semiconductor memory device 800 may be a stack chip type memory device or a stacked memory device which conveys data and control signals through the TSV lines. The TSV lines may be also called through electrodes.

The cell core ECC engine 823 may perform error correction on data which is outputted from the memory die 820-p before the transmission data is sent.

A data TSV line group 832 formed at one memory die 820-p may include 128 TSV lines L1 to Lp. A parity TSV line group 834 may include 8 TSV lines L10 to Lq. The TSV lines L1 to Lp of the data TSV line group 832 and the parity TSV lines L10 to Lq of the parity TSV line group 834 may be connected to micro bumps MCB, which are correspondingly formed among the memory dies 820-1 to 820-p.

The semiconductor memory device 800 may have a three-dimensional (3D) chip structure or a 2.5D chip structure to communicate with the host through a data bus B10. The buffer die 810 may be connected with the memory controller through the data bus B10.

According to an embodiment, referring to FIG. 26, the cell core ECC engine 823 may be included in the memory die, and the via ECC engine 812 may be included in the buffer die. Accordingly, it may be possible to detect and correct soft data fail. The soft data fail may include a transmission error which is generated due to noise when data is transmitted through TSV lines.

Figure 27:
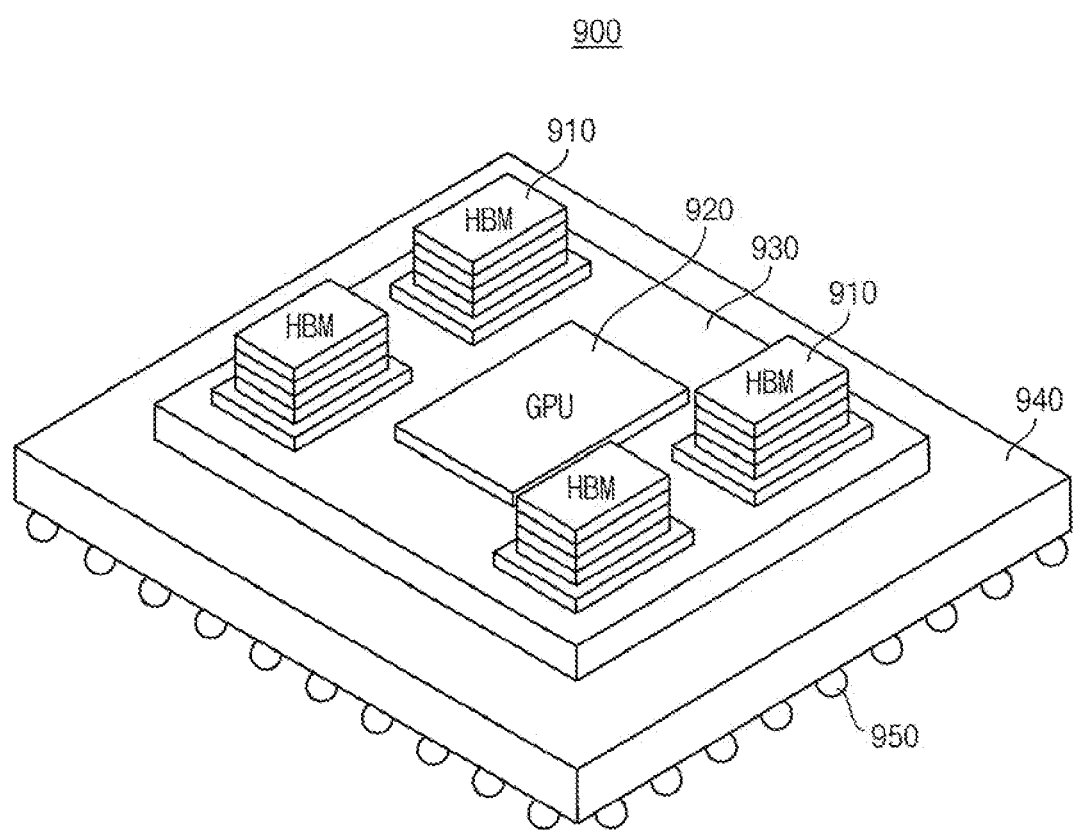
FIG. 27 is a configuration diagram illustrating a semiconductor package including the stacked memory device according to an example embodiment.

FIG. 27 is a configuration diagram illustrating a semiconductor package including the stacked memory device according to an example embodiment.

Referring to FIG. 27, a semiconductor package 900 may include one or more stacked memory devices 910 and a graphic processing unit (GPU) 920.

The stacked memory devices 910 and the GPU 920 may be mounted on an interposer 930. The interposer, on which the stacked memory device 910 and the GPU 920 are mounted, may be mounted on a package substrate 940 mounted on solder balls 950. The GPU 920 may correspond to a semiconductor device which may perform a memory control function. For example, the GPU 920 may be implemented as an application processor (AP). The GPU 920 may include a memory controller having a scheduler.

The stacked memory device 910 may be implemented in various forms, e.g., the stacked memory device 910 may be a memory device in a high bandwidth memory (HBM) form in which a plurality of layers are stacked. Accordingly, the stacked memory device 910 may include a buffer die and a plurality of memory dies, and each of the plurality of memory dies may include a refresh control circuit and a row hammer management circuit.

The plurality of stacked memory devices 910 may be mounted on the interposer 930. The GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. When the stacked memory device 910 includes a direct access region, a test signal may be provided into the stacked memory device 910 through conductive means (e.g., solder balls 950) mounted under package substrate 940 and the direct access region.

Figure 28:
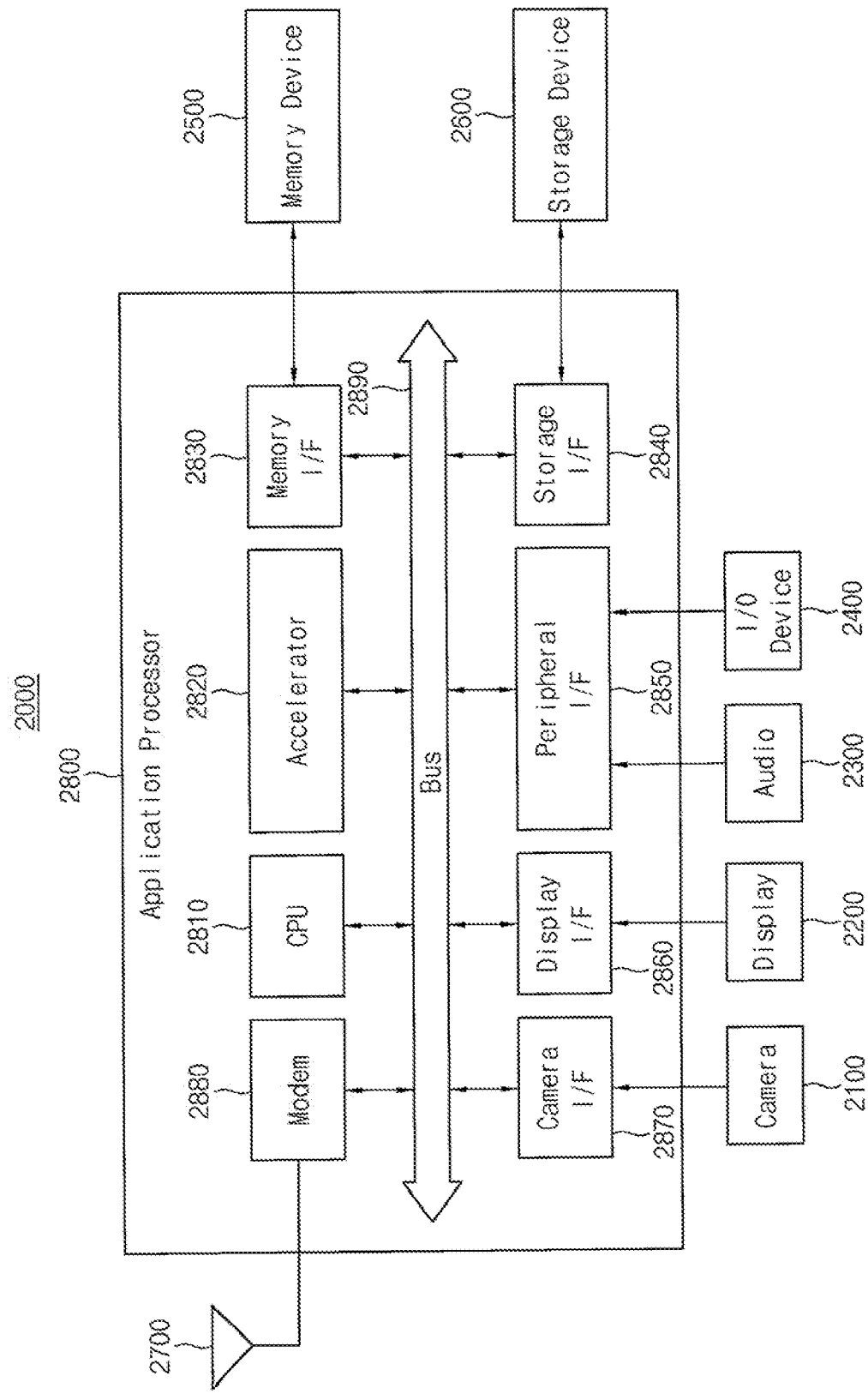
FIG. 28 is a block diagram illustrating an example of a mobile system according to an example embodiment.

FIG. 28 is a block diagram illustrating an example of a mobile system according to an example embodiment.

Referring to FIG. 28, a mobile system 2000 may include a camera 2100, a display 2200, an audio processor 2300, an I/O device 2400, a memory device 2500, a storage device 2600, an antenna 2700, and an application processor (AP) 2800.

The mobile system 2000 may be implemented with one of a laptop computer, a portable terminal, a smart phone, a tablet personal computer (PC), a wearable device, a healthcare device, and internet of things (IoT). The mobile system 2000 may be implemented with a server or a PC.

The camera 2100 may capture an image or a video under control of a user. The camera 2100 may communicate with the AP 2800 through a camera interface (I/F) 2870.

The display 2200 may include, e.g., a liquid crystal display (LCD), an organic light emitting diode (OLED) display, an active matrix (AM)-OLED, or a plasma display panel (PDP). The display 2200 may receive input signals through interactions with a user and may be used as an input device of the mobile system 2000. For example, the display 2200 may be a touch screen display that can receive input signals through a touch operation by a user. The display 2200 may communicate with the AP 2800 through a display interface (I/F) 2860.

The audio processor 2300 may process audio data in contents transferred from the memory device 2500 or the storage device 2600. The audio processor 2300 may perform encoding/decoding or noise filtering on the audio data.

The I/O device 2400 may include various devices that provide a digital input and/or digital output, such as a device to generate signal based on input of the user, a universal serial bus (USB), a digital camera, a secure digital (SD) card, a digital versatile disc (DVD), or a network adaptor. The audio processor 2300 and the I/O device 2400 may communicate with the AP 2800 through a peripheral I/F 2850.

The AP 2800 may control overall operation of the mobile system 2000 through a central processing unit (CPU) 2810.

The AP 2800 may control the display 2200 to display a portion of the contents stored in the storage device 2600. When a user's input is received through the I/O device 2400, the AP 2800 may perform control operation corresponding to the user's input. The AP 2800 may include a bus 2890 through which a modem 2880, the CPU 2810, an accelerator 2820, a memory I/F 2830, a storage I/F 2840, the peripheral I/F 2850, the display I/F 2860, and the camera I/F are connected to each other.

The AP 2800 may be implemented with an SoC to run an operating system (OS). The AP 2800, a memory device 2500, and the storage device 2600 may be implemented by using packages such as package-on-package (POP), ball grid array (BGA), chip scale package (CSP), system-in-package (SIP), multi-chip package (MCP), wafer-level fabricated package (WFP), and wafer-level processed stack package (WSP), etc.

The AP 2800 may further include an accelerator 2820. The accelerator 2820 may be a function block to perform a specified function. The accelerator 2820 may include a graphics processing unit (GPU) to process graphics data, or a neural processing unit (NPU) to perform an artificial operation such as training and/or inference.

The AP 2800 may include a modem 2880, or a modem chip may be disposed outside of the AP 2800. The modem 2880 may receive and/or transmit wireless data through an antenna 2700, modulate signals to be transmitted to the antenna 2700, and/or demodulate signals received from the antenna 2700.

The AP 2800 may include a memory I/F 2830 to communicate with the memory device 2500. The memory I/F 2830 may include a memory controller to control the memory device 2500, and the memory device 2500 may be directly connected to the memory I/F 2830. The memory controller in the memory I/F 2830 may control the memory device 2500 by changing read/write instructions from the CPU 2810, the accelerator 2820, or the modem 2880 to commands for controlling the memory device 2500.

The AP 2800 may communicate with the memory device 2500 through a predefined interface protocol, e.g., an interface protocol such as LPDDR4 or LPDDR5 conformed to JEDEC standards, an interface protocol such as HBM, HMC, or Wide I/O conformed to high bandwidth JEDEC standards, etc.

The memory device 2500 may be implemented with a DRAM device, or may be implemented based on SRAM, PRAM, MRAM, FRAM, or a hybrid RAM, etc.

The memory device 2500 may have relatively smaller latency and bandwidth than latency and bandwidth of the I/O device 2400 and the storage device 2600. The memory device 2500 may be initialized at a timing of power on of the mobile system 2000 and an OS and application data are loaded into the memory device 2500. The memory device 2500 may be used for temporarily storing the OS and application data or a space for executing software.

In an example embodiment, the memory device 2500 may correspond to the semiconductor memory device 200 described with reference to FIGS. 3 through 18. For example, the memory device 2500 may select a hammer address a number of times proportional to access counts during a reference time interval based on a command and an address from a memory controller, and may perform a hammer refresh operation on one or more victim memory cell rows which are physically adjacent to a memory cell row corresponding to the hammer address.

The AP 2800 may include a storage I/F 2840 to communicate with the storage device 2600 and the storage device 2600 may be directly connected to the storage I/F 2840. The storage device 2600 may be provided as a separate chip, and the AP 2800 and the storage device 2600 may be fabricated into one package. The storage device 2600 may be implemented with, e.g., a NAND flash memory.

Aspects of the example embodiments may be applied to systems using semiconductor memory devices that employ volatile memory cells and data clock signals. For example, aspects of the example embodiments may be applied to systems such as a smart phone, a navigation system, a notebook computer, a desk top computer, and a game console that use a semiconductor memory device as a working memory.

As described above, example embodiments may provide a semiconductor memory device capable of managing row hammer based on access ratio of memory cell rows. Example embodiments may provide a method of operating a semiconductor memory device, capable of managing row hammer based on access ratio of memory cell rows.

In a semiconductor memory device and a method of operating the semiconductor memory device according to example embodiments, a row hammer management circuit may generate a hammer address a number of times that is proportional to access counts of an active command corresponding to at least one row address based on the row addresses accompanied by first active commands randomly selected from active commands having a uniform selection probability that is uniform during a reference time interval, and a refresh control circuit may perform a hammer refresh operation on one or more victim memory cell rows which are physically adjacent to a memory cell row corresponding to the hammer address. Therefore, the semiconductor memory device may prevent a row hammer generated by non-uniform attack pattern such as Blacksmith.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a memory cell array including a plurality of memory cell rows, each including a plurality of volatile memory cells;
   a row hammer management circuit configured to:
   capture row addresses accompanied by first active commands randomly selected from active commands, each having a first selection probability that is uniform, from an external memory controller during a reference time interval; and
   select at least one row address from among the captured row addresses as a hammer address a number of times proportional to access counts of an active command corresponding to the at least one row address during the reference time interval; and
   a refresh control circuit configured to receive the hammer address, and to perform a hammer refresh operation on one or more victim memory cell rows which are physically adjacent to a memory cell row corresponding to the hammer address.

2. The semiconductor memory device as claimed in claim 1, wherein:
   the reference time interval corresponds to a refresh interval of the semiconductor memory device, and
   the first selection probability corresponds to a ratio of a number of the hammer refresh operation to be performed on the plurality of memory cell rows during a refresh period of the semiconductor memory device to an average access count of the plurality of memory cell rows during the reference time interval.

3. The semiconductor memory device as claimed in claim 1, wherein:
the row hammer management circuit is configured to select a portion of the row addresses accompanied by the first active commands which are randomly selected based on a random binary code matching a reference binary code, and
the random binary code varies randomly in response to the active commands.

4. The semiconductor memory device as claimed in claim 3, wherein the row hammer management circuit includes:
a random bit generator configured to generate the random binary code in response to the active commands;
a comparator configured to compare the random binary code and the reference binary code, to output a matching signal based on a result of the comparison;
an address capturer configured to output the row addresses accompanied by the first active commands which are randomly selected as the captured row addresses, based on the matching signal;
an address storage configured to store the captured row addresses sequentially;
a hammer address selector configured to select at least one of the captured row addresses stored in the address storage, to output the selected one as the hammer address; and
a control logic configured to control the address storage and the hammer address selector.

5. The semiconductor memory device as claimed in claim 4, wherein the hammer address selector is configured to output the captured row addresses as the hammer address according to an order of being stored in the address storage.

6. The semiconductor memory device as claimed in claim 4, wherein the hammer address selector is configured to output the captured row addresses as the hammer address randomly with a second selection probability that is uniform.

7. The semiconductor memory device as claimed in claim 1, wherein:
the row hammer management circuit is configured to select a portion of the row addresses accompanied by the first active commands which are selected based on a random number matching a counted value obtained by counting the active commands, and
the random number varies randomly in response to the active commands.

8. The semiconductor memory device as claimed in claim 7, wherein the row hammer management circuit includes:
a random number generator configured to generate the random number in response to the active commands;
an active counter configured to count the active commands to output the counted value;
a comparator configured to compare the random number and the counted value, to output a matching signal based on a result of the comparison;
an address capturer configured to output the row addresses accompanied by the first active commands which are randomly selected as the captured row addresses, based on the matching signal;
an address storage configured to store the captured row addresses sequentially;
a hammer address selector configured to select at least one of the captured row addresses stored in the address storage, to output the selected one as the hammer address; and
a control logic configured to control the address storage and the hammer address selector.

9. The semiconductor memory device as claimed in claim 8, wherein the hammer address selector is configured to output the captured row addresses as the hammer address according to an order of being stored in the address storage.

10. The semiconductor memory device as claimed in claim 8, wherein the hammer address selector is configured to output the captured row addresses as the hammer address randomly with a second selection probability that is uniform.

11. The semiconductor memory device as claimed in claim 1, wherein the row hammer management circuit is configured to:
select N first active commands from among the active commands based on a random binary code that varies randomly in response to the active commands matching a reference binary code, N being a natural number greater than one;
store N row addresses accompanied by the N first active commands as first candidate row addresses; and
select at least a portion of the first candidate row addresses as the hammer address.

12. The semiconductor memory device as claimed in claim 11, wherein the row hammer management circuit includes;
a random bit generator configured to generate the random binary code in response to the active commands;
a comparator configured to compare the random binary code and the reference binary code, to output a matching signal based on a result of the comparison;
an address capturer configured to output the N row addresses accompanied by the N first active commands which are randomly selected as the captured row addresses, based on the matching signal;
a candidate address register configured to store the captured row addresses as the first candidate row addresses sequentially;
an address selector configured to select a portion of the first candidate row addresses with a uniform probability to output second candidate row addresses, in response to the candidate address register being full;
an address storage configured to store the second candidate row addresses sequentially;
a hammer address selector, connected to the candidate address register and the address storage, the hammer address selector configured to select at least one of the second candidate row addresses to output the selected one as the hammer address; and
a control logic configured to control the candidate address register, the address storage, and the hammer address selector.

13. The semiconductor memory device as claimed in claim 12, wherein the hammer address selector is configured to select at least one of the first candidate row addresses stored in the candidate address register to output the selected one as the hammer address, in response to a refresh management command from the external memory controller and in response to the address storage being empty at a timing for performing the hammer refresh operation.

14. The semiconductor memory device as claimed in claim 12, wherein the hammer address selector is configured to output the second candidate row addresses as the hammer address according to an order of being stored in the address storage.

15. The semiconductor memory device as claimed in claim 12, wherein the hammer address selector is configured to output the second candidate row addresses as the hammer address randomly with a second selection probability that is uniform.

16. The semiconductor memory device as claimed in claim 1, wherein the refresh control circuit includes:
a refresh control logic configured to generate a hammer refresh signal in response to a hammer address generation signal from the row hammer management circuit;
a refresh clock generator configured to generate a refresh clock signal in response to a refresh control signal;
a refresh counter configured to generate a counter refresh address associated with a normal refresh operation on the plurality of memory cell rows;
a hammer address storage configured to store the hammer address, and configured to output the hammer address in response to the hammer refresh signal; and
a mapper configured to generate hammer refresh addresses designating addresses of the victim memory cell rows based on the hammer address output from the hammer address storage.

17. The semiconductor memory device as claimed in claim 1, further comprising:
at least one buffer die; and
a plurality of memory dies stacked on the at least one buffer die and conveying data through a plurality of through silicon via (TSV) lines,
wherein at least one of the plurality of memory dies includes the memory cell array, the row hammer management circuit, and the refresh control circuit.

18. A method of operating a semiconductor memory device including a memory cell array that includes a plurality of memory cell rows, each including a plurality of volatile memory cells, the method comprising:
capturing row addresses accompanied by first active commands randomly selected from active commands, each having a first selection probability that is uniform, from an external memory controller during a reference time interval;
selecting at least one row address from among the captured row addresses as a hammer address a number of times proportional to access counts of an active command corresponding to the at least one row address during the reference time interval; and
performing a hammer refresh operation on one or more victim memory cell rows which are physically adjacent to a memory cell row corresponding to the hammer address.

19. The method as claimed in claim 18, wherein:
the reference time interval corresponds to a refresh interval of the semiconductor memory device, and
the first selection probability corresponds to a ratio of a number of the hammer refresh operation to be performed on the plurality of memory cell rows during a refresh period of the semiconductor memory device to an average access count of the plurality of memory cell rows during the reference time interval.

20. A semiconductor memory device, comprising:
a memory cell array including a plurality of memory cell rows, each including a plurality of volatile memory cells;
a row hammer management circuit configured to:
capture row addresses accompanied by first active commands randomly selected from active commands, each having a first selection probability that is uniform, from an external memory controller during a reference time interval;
select at least one row address from among the captured row addresses as a hammer address a number of times proportional to access counts of an active command corresponding to the at least one row address during the reference time interval; and
determine a hammer address associated with least one of the plurality of memory cell rows, which is intensively accessed, based on counted values obtained by counting the active commands; and
a refresh control circuit configured to receive the hammer address and to perform a hammer refresh operation on one or more victim memory cell rows which are physically adjacent to a memory cell row corresponding to the hammer address, wherein:
the first selection probability corresponds to a ratio of a number of the hammer refresh operation to be performed on the plurality of memory cell rows during a refresh period of the semiconductor memory device to an average access count of the plurality of memory cell rows during the reference time interval, and
the row hammer management circuit is configured to select a portion of the row addresses accompanied by the first active commands, which are randomly selected based on a random binary code that varies randomly in response to the active commands, matching a reference binary code.

* * * * *